United States Patent [19]

Tsukude et al.

[11] Patent Number: 5,666,315
[45] Date of Patent: Sep. 9, 1997

[54] SEMICONDUCTOR MEMORY DEVICE HAVING A REDUNDANCY FUNCTION SUPPRESSIBLE OF LEAKAGE CURRENT FROM A DEFECTIVE MEMORY CELL

[75] Inventors: Masaki Tsukude; Kazutami Arimoto, both of Hyogo, Japan

[73] Assignee: Mitsubishi Denki Kabushiki Kaisha, Tokyo, Japan

[21] Appl. No.: 576,351

[22] Filed: Dec. 21, 1995

[30] Foreign Application Priority Data

Dec. 28, 1994 [JP] Japan ................................. 6-328151

[51] Int. Cl.$^6$ ............................................ G11C 7/00
[52] U.S. Cl. .......................... 365/200; 365/149; 365/226
[58] Field of Search ............................. 365/149, 200, 365/226, 227, 228

[56] References Cited

U.S. PATENT DOCUMENTS 4,666,584  5/1987  Okada et al. .

5,532,965  7/1996  Kenney ................................. 365/200

OTHER PUBLICATIONS

1993 IEEE International Solid–State Circuits Conference pp. 48–49.

*Primary Examiner*—David C. Nelms
*Assistant Examiner*—F. Niranjan
*Attorney, Agent, or Firm*—Lowe, Price, LeBlanc & Becker

[57] ABSTRACT

In a reading/writing operation, a bit line pair group including a defective memory cell is replaced with a spare bit line pair group. Supply of a precharge potential to a bit line equalize circuit and a power supply interconnection of a sense amplifier is effected by an interconnection $V_{BL_n}$ connected to ground for every bit line pair group. In the replacement of the bit line pair group, supply of a precharge potential to the bit line pair group is cut by a fuse element.

15 Claims, 18 Drawing Sheets

SEMICONDUCTOR MEMORY DEVICE HAVING A REDUNDANCY FUNCTION SUPPRESSIBLE OF LEAKAGE CURRENT FROM A DEFECTIVE MEMORY CELL

BACKGROUND OF THE INVENTION

1. Field of the Invention

The present invention relates to a semiconductor device including a redundancy circuit, and a method of operation thereof.

2. Description of the Background Art

In accordance with increase in the integration density of semiconductor memory devices, particularly of dynamic type RAMs (DRAM), the consumption power during a stand-by operation is ever increasing. Particularly in a DRAM, stored information is maintained by rewriting/rereading the stored data even during a stand-by state, so that there is a limit in reducing the consumption power during a stand-by state in principle.

It is a critical issue to achieve any reduction in the consumption power during a stand-by state in a system that uses a great amount of DRAM.

Increase in the integration density also causes increase in the occurrence of defective memory cells.

In order to compensate for generation of error due to such defective memory cells, the approach by the so-called redundancy circuit is carried out where a column of memory cells in which a defective memory cell is present is replaced with an auxiliary column of memory cells or the like.

By virtue of such replacement, the basic operation of reading/writing data of a memory cell is carried out smoothly. However, a leakage current path of the defective portion is still present even when the relevant defection is repaired by the redundancy circuit. This means that the consumption power during a stand-by state of the DRAM is further increased.

The above circumstance will be described in detail with reference to FIG. 18 showing a structure of a conventional DRAM.

The operation of each component will first be described briefly.

In a Y address comparator circuit 38, an address detected as including a defective bit at the time of previous testing is stored in a non-volatile memory such as a fuse circuit.

When an externally applied address signal 40 does not match the above identified address including a defective bit, a column select line drive circuit 34, for example, is activated, whereby a column select line (referred to as "CS line" hereinafter) 24 is pulled up to an H level (logical high).

By an I/O gate 19 of a bit line pair group unit 102 (corresponding to I/O gate 18 in bit line pair group unit 100), a pair of bit lines BL3, /BL3 is connected to a data input/output line 20.

The potential difference of bit line pair BL3, /BL3 is amplified by a sense amplifier 17 according to stored information in a memory cell connected thereto and selected by a signal of a word line not shown.

By the above operation, information in a memory cell is externally read out.

If there is a shorting portion 200 between bit line BL1 and the ground level, data cannot be read/written with respect to a memory cell connected to that bit line.

In this case, the defective bit line is replaced with an auxiliary bit line. In general, this replacement is carried out not in the unit of a bit line, but in the unit of a bit line pair group connected by a CS line.

More specifically, the address of CS line 22 corresponding to bit line pair group unit 100 to which the defective bit line BL1 belongs is preprogrammed in a Y address comparator circuit 38.

Externally applied address 40 is compared with this programmed defective address by Y address comparator circuit 38. When the two values match each other, a signal (SE signal) activating a space column decoder is applied to a CS line drive circuit 36, whereby a bit line pair group unit 104 formed of spare bit line lines of a spare BL1 and a spare /BL1 is selected.

At the same time, a signal (NED signal) inactivating the CS line associated with the defective bit line BL1 is applied to a CS line drive circuit 32.

Thus, replacement of a defective bit is carried out. There is no problem in the basic operation of the memory cell.

However, as disclosed in U.S. Pat. No. 4,663,584, for example, the bit line pair is precharged to the level of a potential $V_{BL}$ supplied by a bit line potential generation circuit (not shown) in the chip prior to an amplify operation of sense amplifier 16 according to the data in the memory cell. Here, potential $V_{BL}$ is set to $\frac{1}{2} V_{cc}$ where $V_{cc}$ is the potential supplied from a power supply 2.

The value of $V_{BL}$ is not limited to $\frac{1}{2} V_{cc}$, and an arbitrary value can be set.

A first power supply line S2P connected to power supply 2 bias a switching transistor 10 and leading to a sense amplifier, and a second power supply line S2N connected to ground via a switching transistor 12 and leading to a sense amplifier are also precharged as the bit line pair. Each of first and second power supply lines S2P and S2N is generally referred to as line S2 hereinafter.

Therefore, a first leakage current path 202 and a second leakage current path 204 are generated due to the presence of shorting portion 200. In first leakage current path 202, the current from the supply line of the potential of the bit line potential generation circuit through a bit line equalize circuit 14 coupling the pair of bit lines BL1 and /BL1 in common to potential $V_{BL}$ leaks through bit line BL1. In second leakage current path 204, the current from a S2 line equalize circuit 4 coupling line S2 in common to potential $V_{BL}$ leaks through line S2, sense amplifier 16, and bit line BL1.

As a result, the problem that the stand-by current becomes larger in the memory cell unit occurs.

There is also a disadvantage that the operation margin with respect to $V_{BL}$ is significantly reduced since potential $V_{BL}$ becomes lower than the design value.

This will be described according to the timing chart of FIG. 19 thereof.

At time $t_0$, all the pairs of bit lines should be precharged to the level of potential $V_{BL}$. However, the potential of bit line pair BL1, /BL1 associated with the defective bit is lower than potential $V_{BL}$ ($=\frac{1}{2} V_{cc}$) due to leakage current.

Line S2 of the sense amplifier is also lower than precharge voltage $V_{BL}$ due to leakage current. It is to be noted that reduction in the potential of line S2 influences the operation of all the sense amplifiers connected in common to line S2.

Following the transition of a line address strobe signal /RAS to an L level from an H level at time $t_2$, an internal signal BLEQ is pulled down to an L level from an H level at time $t_3$, whereby the bit line pair is electrically isolated.

Similarly, S2 line equalize circuit 8 is turned off, whereby the pair of line S2 is electrically isolated.

Then, at time $t_5$, switching transistors 10 and 12 are turned on in response to signals /SOP and SON, respectively, whereby sense amplifier 16 is activated.

As a result, the pair of bit lines BL1, /BL1 and the pair of spare lines BL1 and /BL1 has one potential driven to the level of $V_{cc}$ and the other to the level of ground according to the stored information in the memory cells selected correspondingly.

At the transition of signals NED and SE to an H level from an L level at time $t_8$, CS1 line 22 maintains its inactive state, and spare CS line 26 is activated. As a result, data is provided to data input/output line (I/O line (20)).

At time $t_{12}$, signal /RAS is driven to an H level from an L level. At time $t_{13}$, signal BLEQ is driven to an H level from an L level.

At the same time, the sense amplifier attains an inactive state by signals /SOP and SON. In response to signal BLEQ, the bit line pair is precharged to the level of $V_{BL}$ again. However, the potential of bit line pair BL1, /BL1 is lowered by leakage current. Also, the potential of line S2 is reduced.

Thus, the potential of line S2 prior to activation of the sense amplifier is lower than $V_{BL}$ ($=\frac{1}{2} V_{cc}$) due to leakage current. The resulting reduction in the $V_{BL}$ margin has become a serious problem in recent years in accordance with increase of the capacity of the memory.

Due to increase in the memory capacity and microminiaturization in the device size, reduction in the power supply voltage is required from the standpoint of reliability. Therefore, the problem of degradation in the $V_{BL}$ margin due to reduction in voltage is further aggravated due to reduction in $V_{BL}$ by a leakage current path.

A conventional semiconductor memory device has the problem that the actual stand-by current of a memory cell portion is increased and the operation margin with respect to potential $V_{BL}$ is degraded due to a leakage current of a defective portion.

SUMMARY OF THE INVENTION

An object of the present invention is to provide a semiconductor memory device that can have consumption power reduced during stand-by, and a method of operation thereof.

Another object of the present invention is to provide a semiconductor memory device in which the potential of a bit line and a S2 line of a sense amplifier can be prevented from being lowered at the time of precharging caused by a defective memory cell portion, if any.

According to the present invention, a semiconductor memory device includes a memory cell array of a plurality of memory cells from or to which stored information is read/written with a constant number of memory cell columns or memory cell rows as a unit, wherein a plurality of the read/write units in the memory cell array form a proper cell array, and at least one of the read/write unit forms an auxiliary memory cell array that replaces a relevant read/write unit when there is a defective memory cell in the proper memory cell array. The semiconductor memory device includes a first power supply, a second power supply, a plurality of bit lines, a plurality of sense amplifiers, a third power supply, a plurality of power supply interconnections, a plurality of first switching circuits, and a plurality of second switching circuits.

The first power supply provides a first potential corresponding to a first logic level of stored information. The second power supply provides a second potential corresponding to a second logic level of stored information.

Each of the plurality of bit lines is connected to at least one memory cell. Each of a plurality of sense amplifiers is connected to a bit line and provides the first or second potential according to the stored information in a memory cell. The sense amplifier includes a first power supply input terminal to which the first potential is supplied, and a second power supply input terminal to which the second potential is supplied. The third power supply provides a third potential. The plurality of power supply interconnections provide the third potential to each read/write unit of the memory cell array. The plurality of first switching circuits respond to an external control signal for opening/closing the connection of each bit line and each first and second power supply input terminals of the sense amplifier to the third potential supplied from the plurality of power supply interconnections. The plurality of second switching circuits can set the connection of the plurality of power supply interconnections to a corresponding plurality of read/write units individually and in a non-volatile manner.

According to another aspect of the present invention, a semiconductor memory device includes a memory cell array of a plurality of memory cells from or to which reading/writing of information is carried out with a constant number of memory cell columns or rows as a unit, wherein a plurality of the read/write units form a proper memory cell in the memory cell array, and at least one of the read/write unit forms an auxiliary memory cell array replacing a relevant read/write unit out of said memory cell array when there is a defective memory cell in the proper memory cell array. The semiconductor memory device includes a first power supply, a second power supply, a pair of interconnections, a first switching circuit and a second switching circuit.

The first power supply provides a first potential corresponding to a first logic level of stored information. The second power supply provides a second potential corresponding to a second logic level of stored information. At least one pair of interconnections is present in the memory cell column or memory cell row unit. The interconnection pair is held at a third potential intermediate the first and second potentials prior to initiation of a reading/writing operation of stored information, and can be electrically connected to a memory cell. The first switching circuit is provided corresponding to each interconnection pair, and responds to an external control signal for switching between a first state where one interconnection of the pair of interconnections is set to the level of a first potential and the other to the level of a second potential, and a second state where the pair of interconnections is set at an electrically floating state.

The second switching circuit is provided for every pair of interconnections to open/close the connection between the pair of interconnections.

A main advantage of the present invention is to suppress increase in current during a stand-by state even when there is a defective memory cell by cutting the connection of a read/write unit of a memory cell column or memory cell row from which leakage current is generated from the power supply interconnection providing the third potential by the second switching circuit. The other advantages are set forth in the following.

The at least one pair of interconnections in the read/write unit of a memory cell column or memory cell row attains an electrically floating state while one attains the level of the first potential and the other the level of the second potential.

The pair of interconnection is driven to the third potential by having both interconnections connected by the second switching means while still attaining the electrically floating state. Therefore, a source for generating a third potential is not required. Furthermore, there is no current that leaks via the shorting portion of a defective memory cell from the power supply of a third potential. Therefore, increase in consumption power during stand-by can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
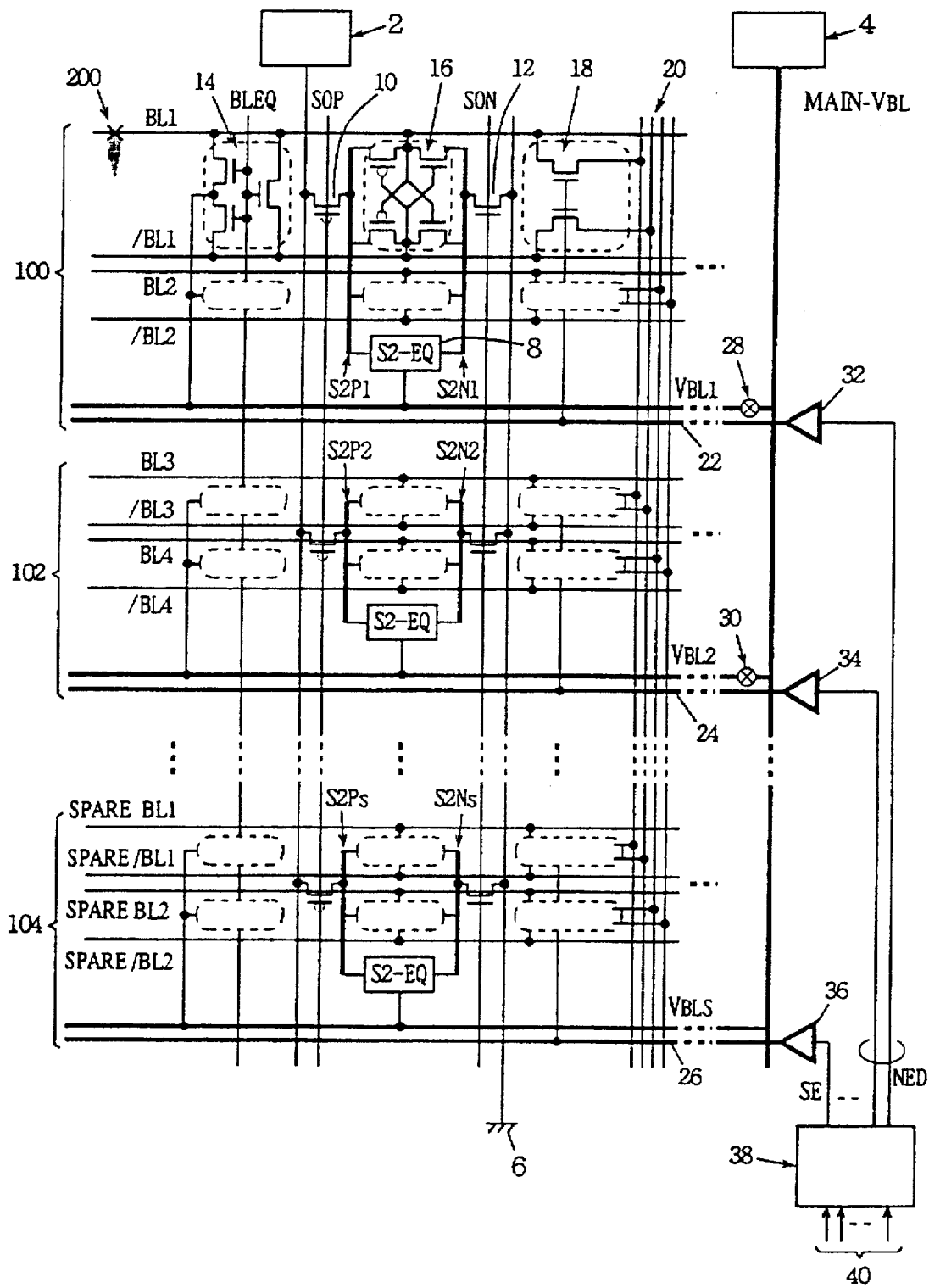
FIG. 1 is a block diagram schematically showing a first embodiment of the present invention.

FIG. 1 is a schematic block diagram of the main part of a DRAM according to a first embodiment of the present invention.

Figure 18:
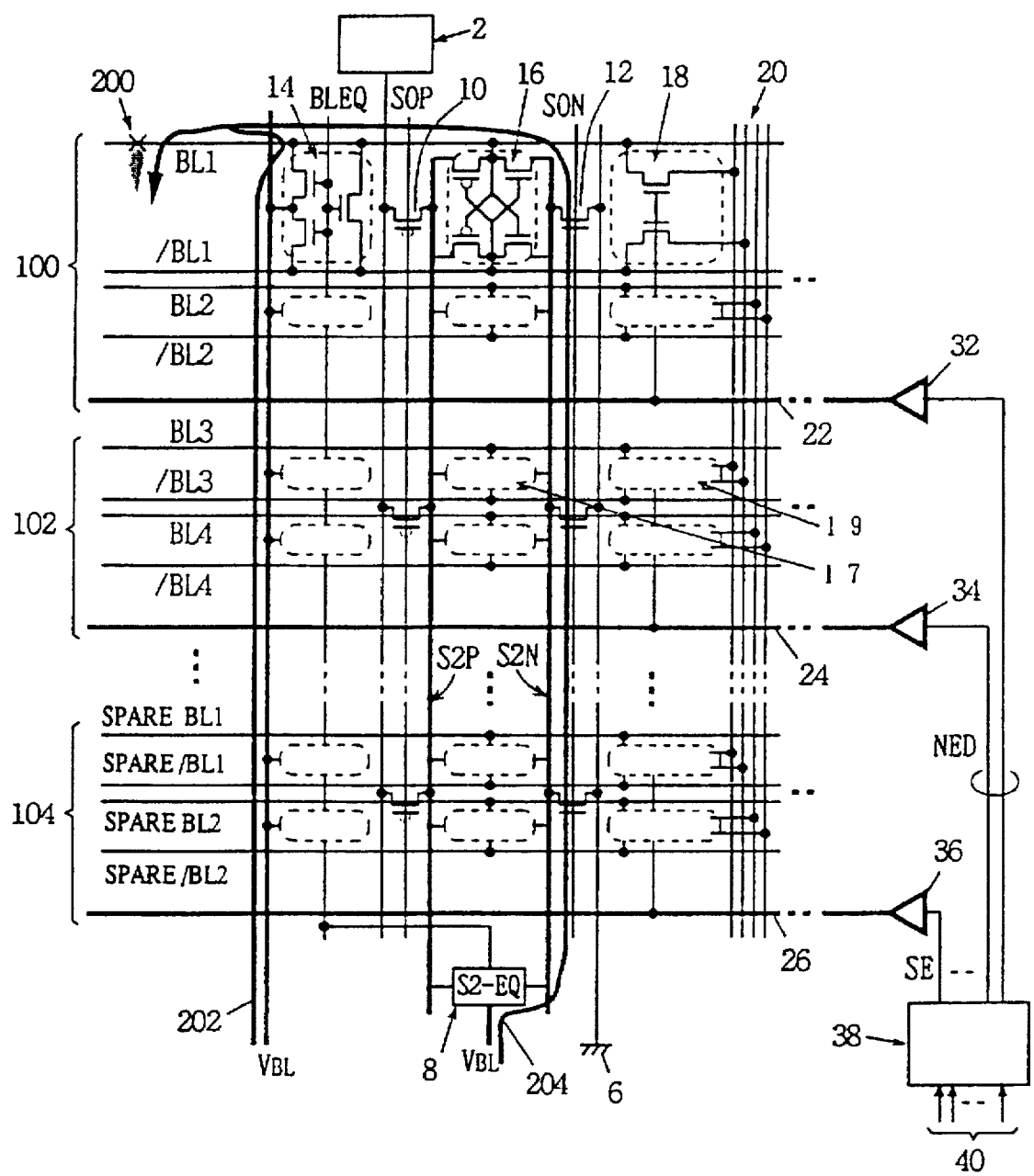
FIG. 18 is a block diagram schematically showing a conventional dynamic type semiconductor memory device.
Figure 19:
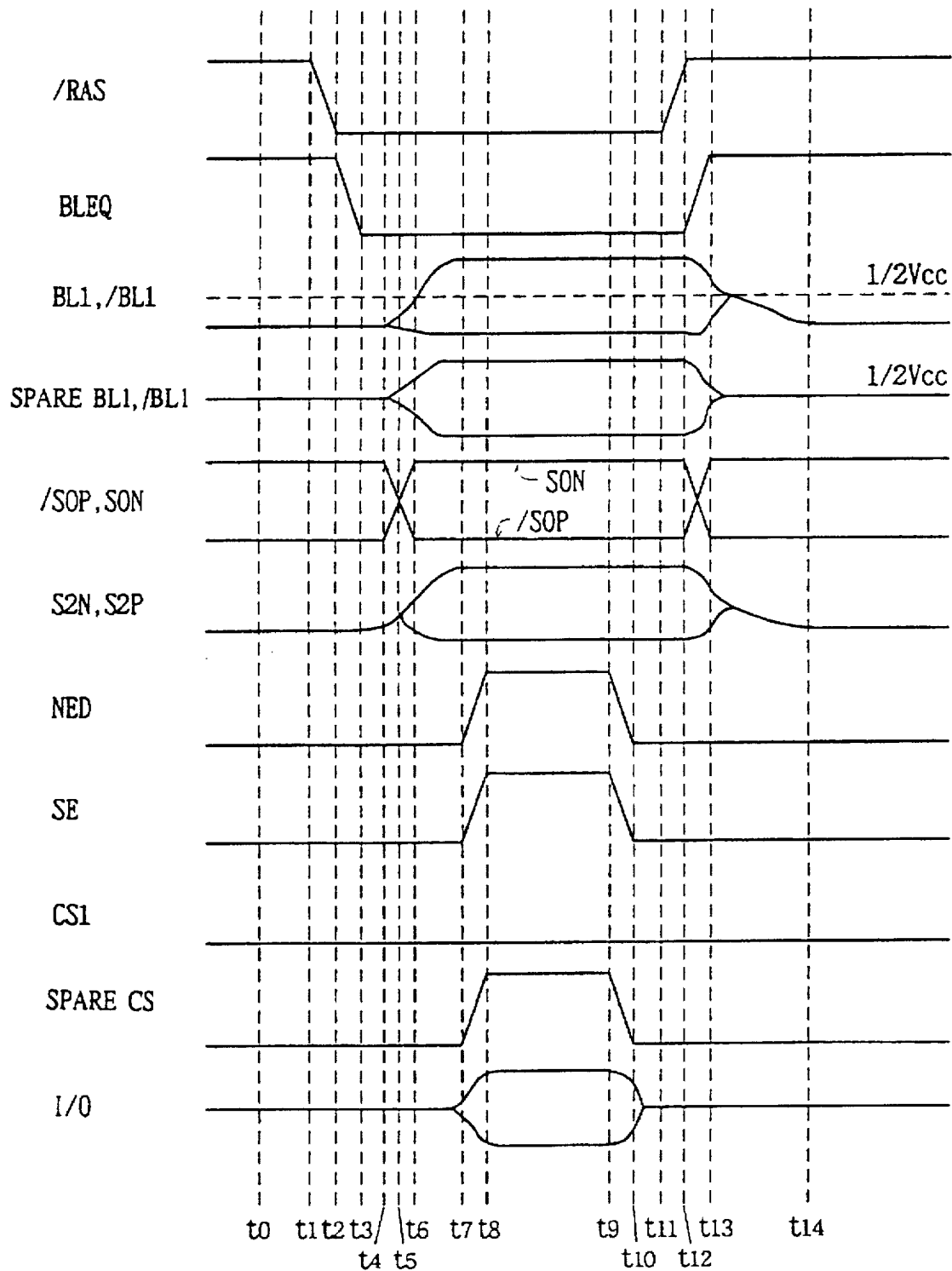
FIG. 19 is a timing chart showing an operation of a conventional dynamic type semiconductor memory device.

In the drawing, reference characters identical to those of FIG. 18 indicate the same component.

The DRAM of the first embodiment differs from a conventional DRAM in that power supply lines $V_{BL1}$, $V_{BL2}$, ..., $V_{BLS}$ supplying a precharge potential $V_{BL}$ for bit lines and line S2 of a sense amplifier are arranged in parallel to line CS for every bit line pair group unit.

These precharge potential power supply lines and a corresponding memory cell array unit are connected by respective non-volatile switching means, for example, a fuse element.

Line S2 is isolated by every big line pair group unit 100, 102, 104 which is the unit by which replacement is carried out when there is a defective bit. A S2 line equalize circuit S2-EQ that opens/closes the connection between the S2 line pair is provided at each line S2.

When there is a shorting portion 200 at a memory cell connected to bit line BL1 in bit line pair group unit 100, fuse element 28 is blown out.

As a result, both leakage current paths are cut off so that no leakage current flows in the present structure in contrast to the prior case where first and second leakage current paths were present even after replacement of the bit line pair group unit including the defective bit.

Thus, increase in the stand-by current due to a defective bit after replacement can be prevented.

Figure 2:
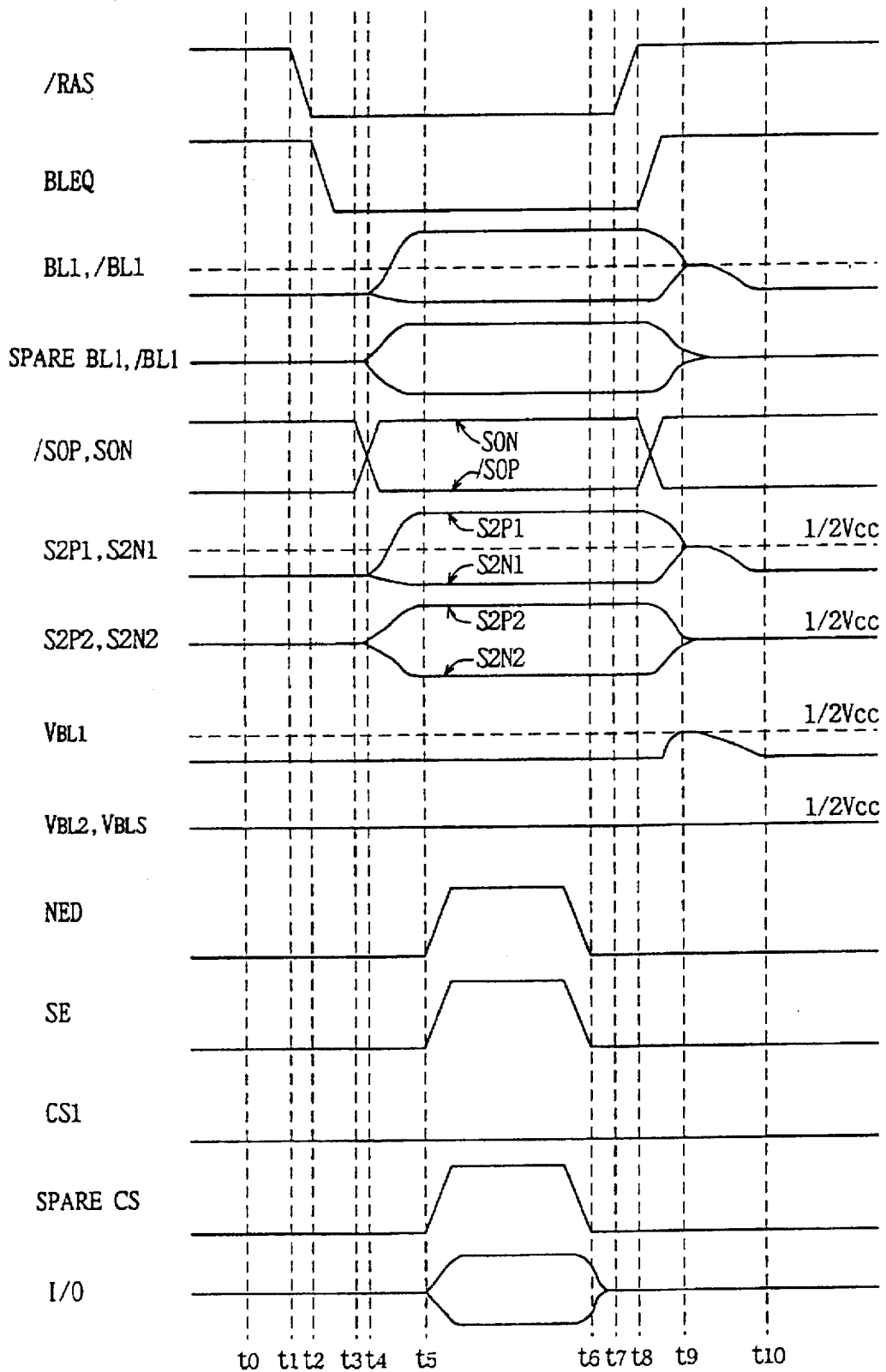
FIG. 2 is a timing chart for describing an operation of the first embodiment.

FIG. 2 is a timing chart showing an operation of the first embodiment. The basic operation is similar to that of a conventional one. A sense operation is carried out even in the pair of bit lines BL1, /BL1 to which a defective bit is connected. Therefore, the potential therebetween is amplified.

Since there is a leakage current between bit line BL1 and ground, bit line BL1 and bit line /BL1 are amplified to an L level and an H level, respectively.

The basic operation is not affected since this bit line pair is replaced with the auxiliary bit line pair of a spare BL1 and a spare /BL1.

At time $t_9$, in response to the transition of signal BLEQ to an H level from an L level, bit lines BL and /BL1 are connected to attain the level of $\frac{1}{2} V_{cc}$. However, the voltage level of the bit line pair is gradually lowered due to leakage current. At time $t_{10}$, the potential attains a constant value of a sufficient low level.

No leakage current is conducted thereafter since fuse element 28 is blown out.

In a conventional redundancy circuits it was impossible to obtain a remedy for increase in current during stand-by even if the bit line pair group unit with the defection is repaired.

In the present embodiment, line S2 is isolated in the unit of replacement as well as the precharge power supply interconnection of a bit line and line S2 with the leakage current path cut off by a fuse element. Therefore, the above problem can be alleviated.

In the first embodiment of FIG. 1, a fuse element is provided only at the precharge power supply interconnection corresponding to a proper bit line pair group unit.

By also providing a fuse element at a power supply interconnection corresponding to an auxiliary bit line pair group unit 104, the problem of increase in stand-by current due to a defective bit in the spare memory cell can be accommodated.

Figure 3:
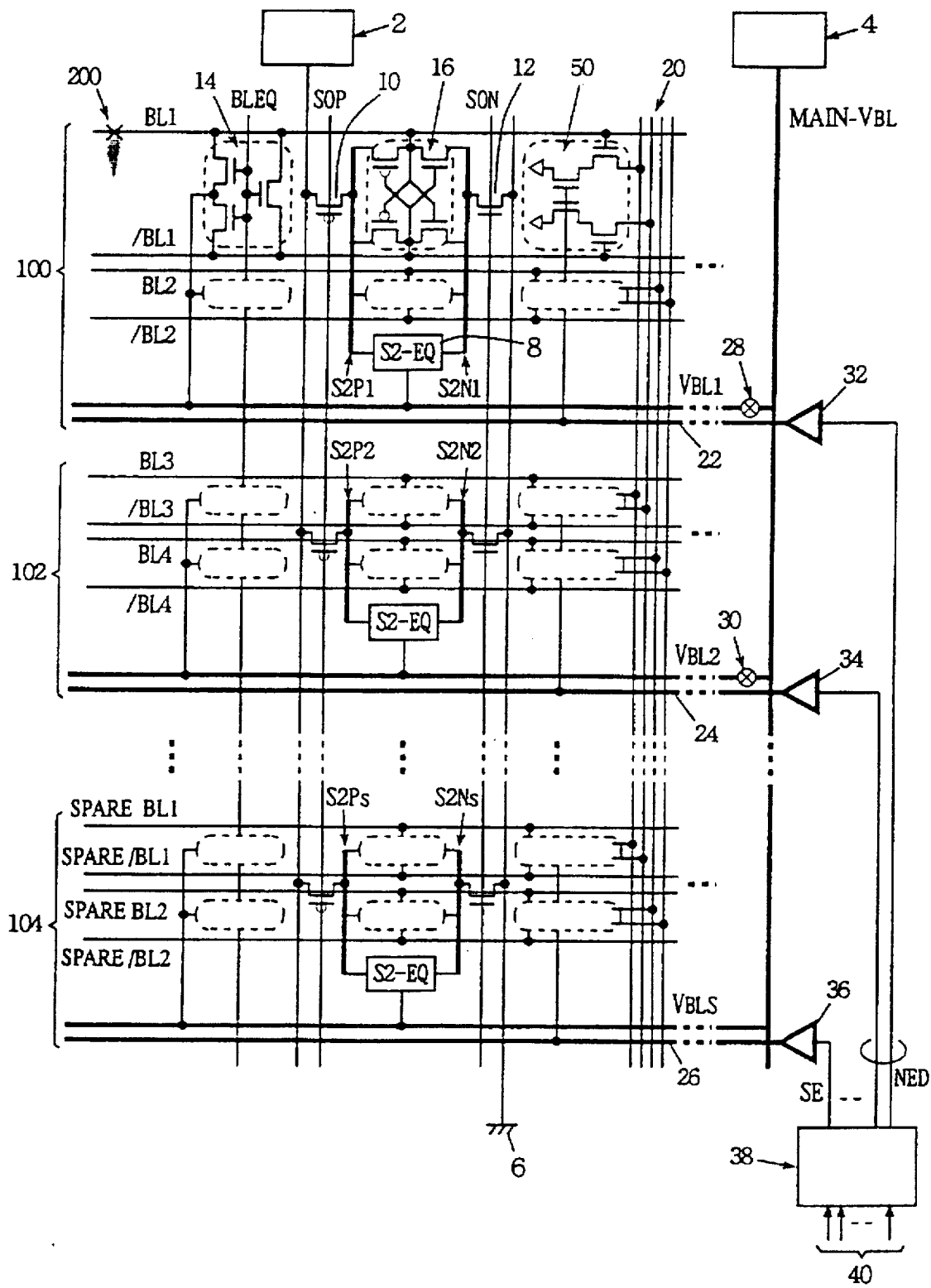
FIG. 3 is a block diagram schematically showing a second embodiment of the present invention.

FIG. 3 is a schematic block diagram showing the component of a DRAM according to a second embodiment of the present invention. In the first embodiment, the latching ability of the sense amplifier is degraded due to reduction in the capacitance of line S2 caused by isolation of line S2 of the sense amplifier.

When line CS is activated to transfer data of a bit line to the I/O line, there is a possibility of the initial potential level of the I/O line to be transferred to the sense amplifier side to damage the data latched by the sense amplifier at the moment the I/O line is connected to the bit line.

In the second embodiment, the I/O gate connecting an I/O line and the bit line is formed of a direct sensing read amplifier circuit 50 as set forth in the following.

In direct sensing read amplifier circuit 50, line CS is connected in common to the gates of one pair of first N channel MOSFETs having sources grounded. One pair of second N channel MOSFETs having its source connected to the drain of the pair of first N channel MOSFETs has its gate connected to the bit line pair and its gate connected to an I/O line.

Therefore, the potential of the I/O line is not directly transmitted to the bit line.

More specifically, even when line S2 is isolated and the latching capability of the sense amplifier is degraded, damage of the data at the sense amplifier side caused by the initial potential of the I/O line is prevented.

A similar effect can be obtained in a structure where one pair of first N channel MOSFETs has its gate connected to the bit line pair and one pair of second N channel MOSFETs has its gate connected to line CS.

The above operation will be described with reference to the timing chart of FIG. 4.

It is assumed that the potential of the I/O line is precharged to an H level in the following description.

In response to activation of signals /SOP and SON at time $t_1$, the sense amplifier is activated, whereby the potential difference of bit line pair $BL_n$, /$BL_n$ is amplified according to the stored information in the selected memory cell.

At time $t_4$ when the transition of line $CS_n$ to an H level from an L level is initiated, the potential of the I/O line also begins to be altered.

Figure 4:
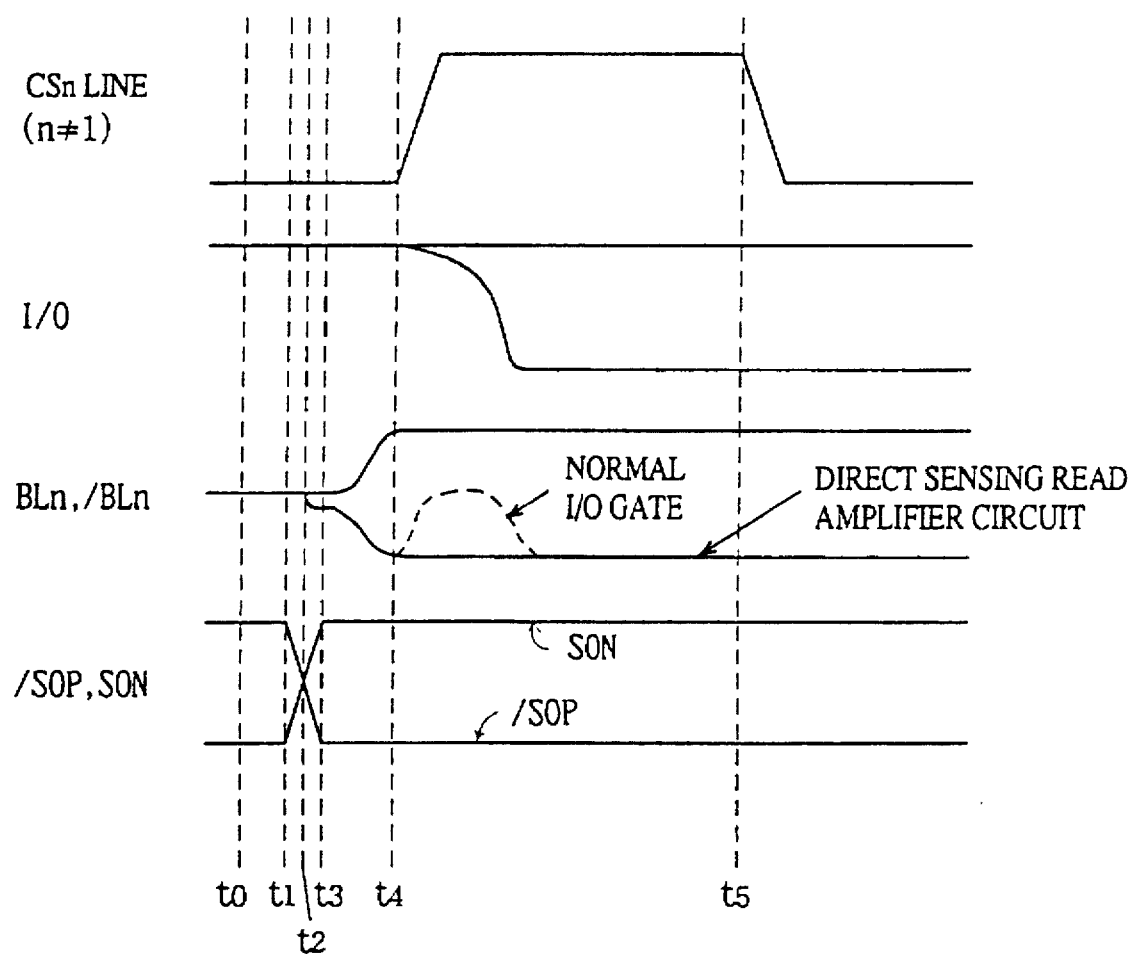
FIG. 4 is a timing chart showing an operation of the second embodiment of the present invention.

In a general I/O gate (corresponding to gate 18 in FIG. 1), the potential of the bit line attaining an L level exhibits a transition as shown by the dotted line in FIG. 4 due to the initial potential of the I/O gate. If this transition is too great, data will be damaged.

In direct sensing read amplifier circuit 50 of the present embodiment, the potential level of the I/O line connected to the bit line attaining an H level is pulled down to an L level. However, since the bit line is not directly coupled to the I/O line, there is hardly no change in the potential of the bit line by the potential of the I/O line. Therefore, data will not be damaged.

Figure 5:
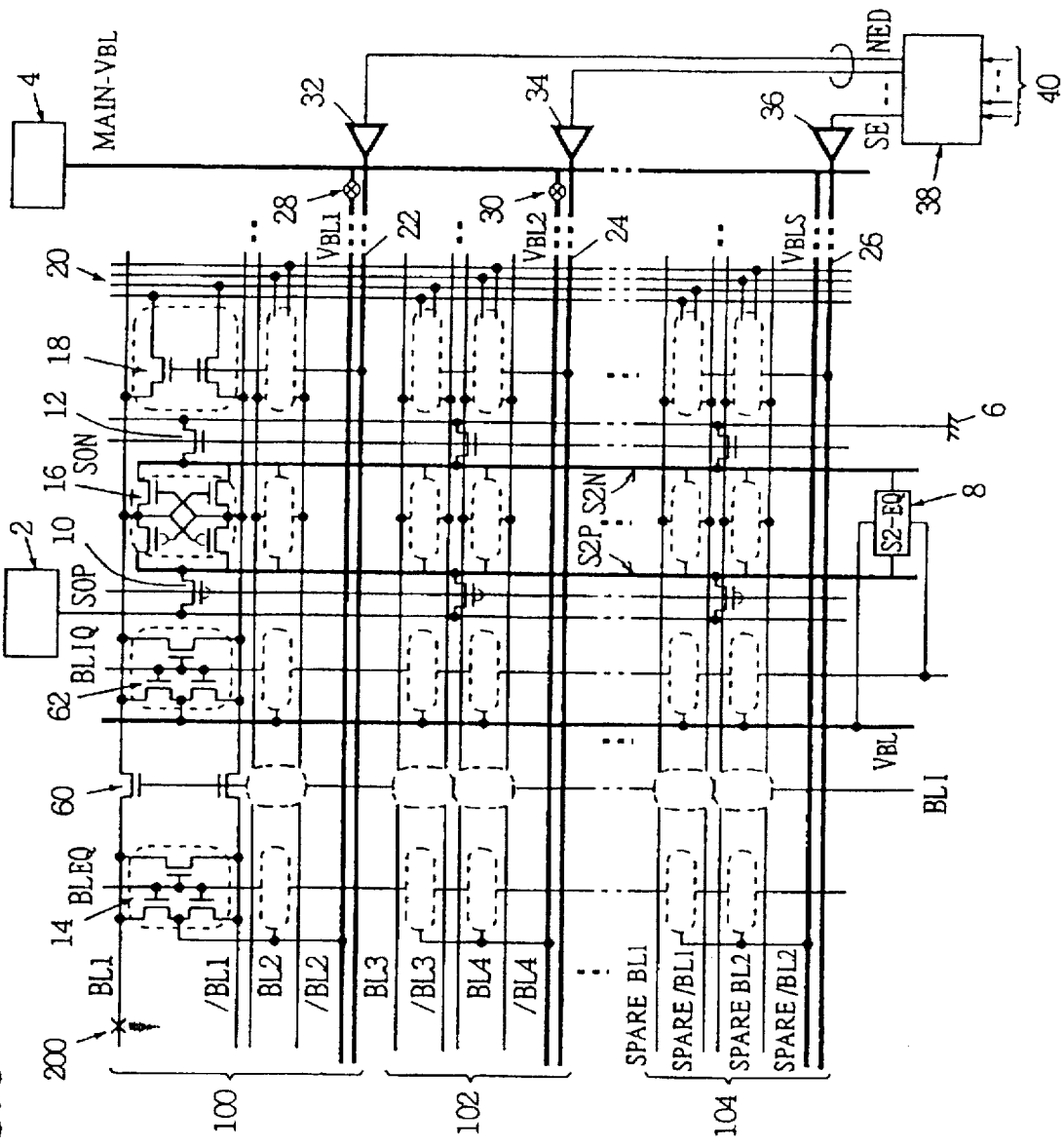
FIG. 5 is a block diagram schematically showing a third embodiment of the present invention.

FIG. 5 is a schematic block diagram showing the components of a DRAM according to a third embodiment of the present invention.

The DRAM of the third embodiment differs from the DRAM of the second embodiment in the following four points.

Firstly, line S2 is not isolated for every bit line pair group unit.

Secondly, the bit line of the memory cell side can be isolated from the bit line of the sense amplifier side by a transfer gate 60 therebetween.

Thirdly, an equalize circuit 14 is provided at the side of the bit line pair where memory cells are provided. Supply of a precharge potential towards this circuit is carried out by a precharge power supply interconnection $V_{BLn}$ provided for every bit line pair group unit and including a fuse element.

Fourthly, an equalize circuit 62 is provided at the side of the bit line where the sense amplifier is provided. Supply of a precharge potential towards equalize circuit 62 and line S2 is carried out by a main precharge power supply interconnection connected in common to each bit line pair group unit.

Figure 6:
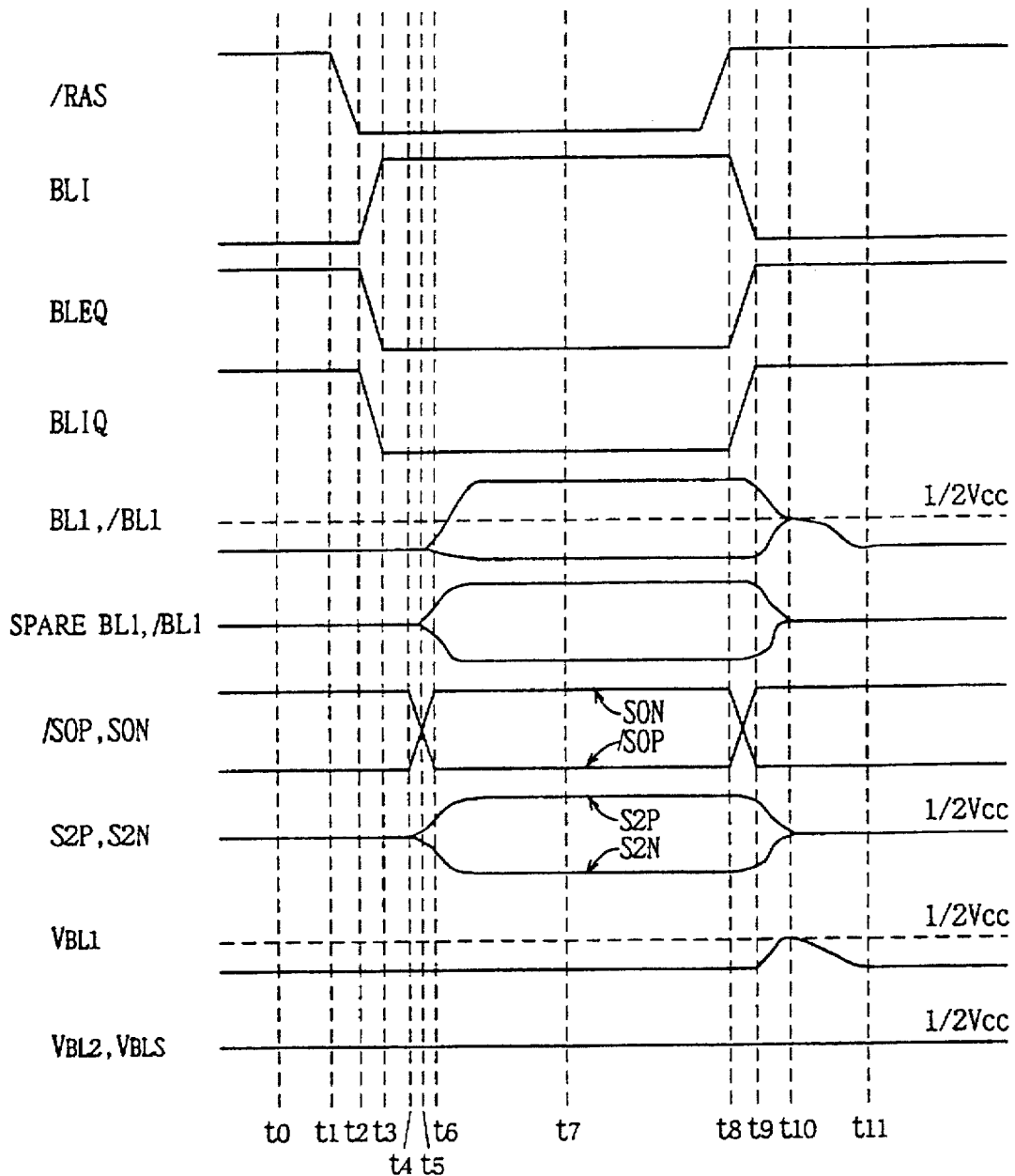
FIG. 6 is a timing chart showing an operation of the third embodiment.

The operation thereof is described hereinafter with reference to the timing chart of FIG. 6.

At time $t_0$, signal BLI attains an L level, and transfer gate 60 is turned off.

Therefore, the interconnection for supplying a precharge potential to line S2 of the sense amplifier and to bit line equalize circuit 62 is isolated from the side of the bit line pair where the memory cells are provided.

At time $t_2$, signal BLI is pulled up to an H level from an L level, and transfer gate 60 is turned on. Bit line equalize signals BLEQ and BLIQ are driven to an L level from an H level, whereby the supply of a precharge potential to the bit line and to line S2 is cut off.

Then, the sense amplifier carries out a general operation, and a signal is read out. At time $t_9$, signal BLI attains an L level, whereby transfer gate 60 is turned off.

Under this state, the operation of precharging the bit line pair at the memory cell side is carried out by equalize circuit 14.

Simultaneously, the operation of precharging the bit line pair provided at the sense amplifier side is carried out by equalize circuit 62.

During the precharge operation, the main precharge power supply interconnection is isolated from defective memory cell portion 200.

Therefore, the leakage current path is cut off to suppress increase in stand-by current.

By blowing out fuse element 28, precharge power supply 4 can be isolated from defective memory cell portion 200.

Since line S2 of the sense amplifier is not isolated in the present embodiment, the problem of reduction in the latching ability of a sense amplifier encountered in the first embodiment is eliminated.

Figure 7:
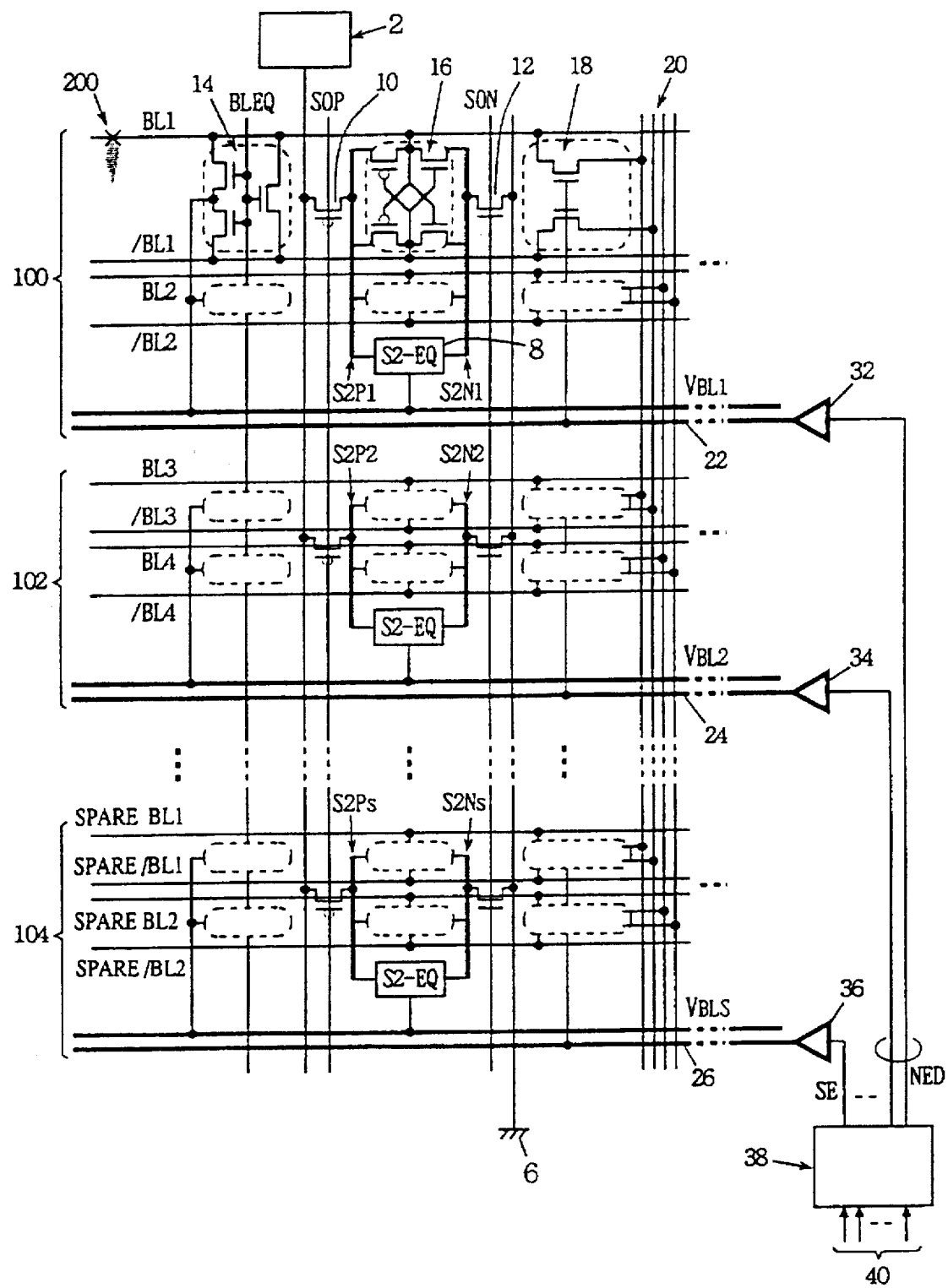
FIGS. 7 and 8 are block diagrams schematically showing a fourth embodiment and a fifth embodiment, respectively, of the present invention.

FIG. 7 is a schematic block diagram showing the components of a DRAM according to a fourth embodiment.

The difference in structure from the first embodiment is that precharge supply 4 is eliminated and precharge power supply interconnections $V_{BL1}, V_{BL2}, \ldots, V_{BLS}$ are set to an electrically floating state. The reason thereof will be described hereinafter.

In this case, there is a possibility of reduction in the latching ability as in the first embodiment due to isolation of line S2 of the sense amplifier.

Figure 8:
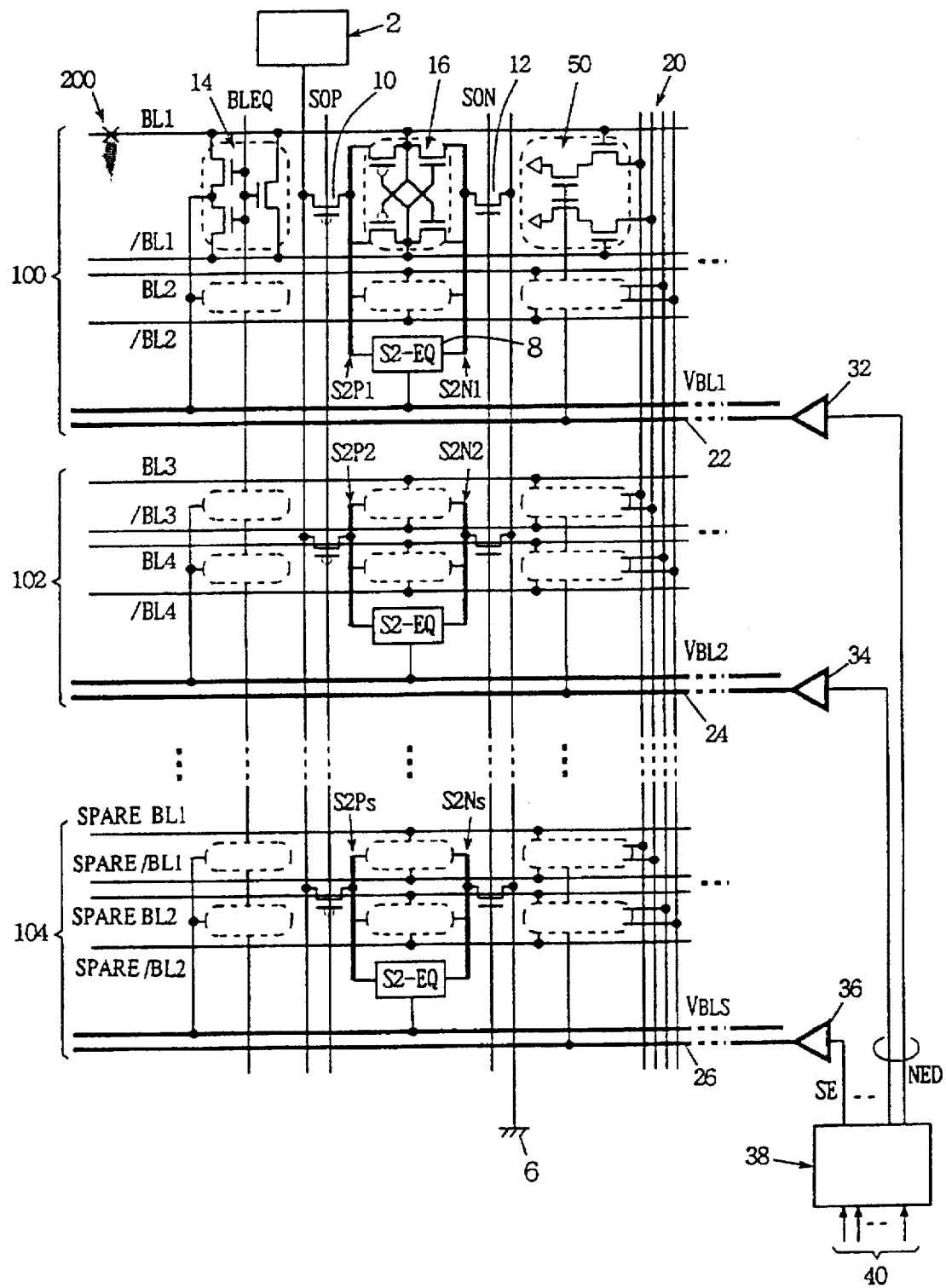

In order to improve this problem, a direct sensing read amplifier circuit 50 is provided as the I/O gate, as in the DRAM of the fifth embodiment shown in FIG. 8.

Figure 9:
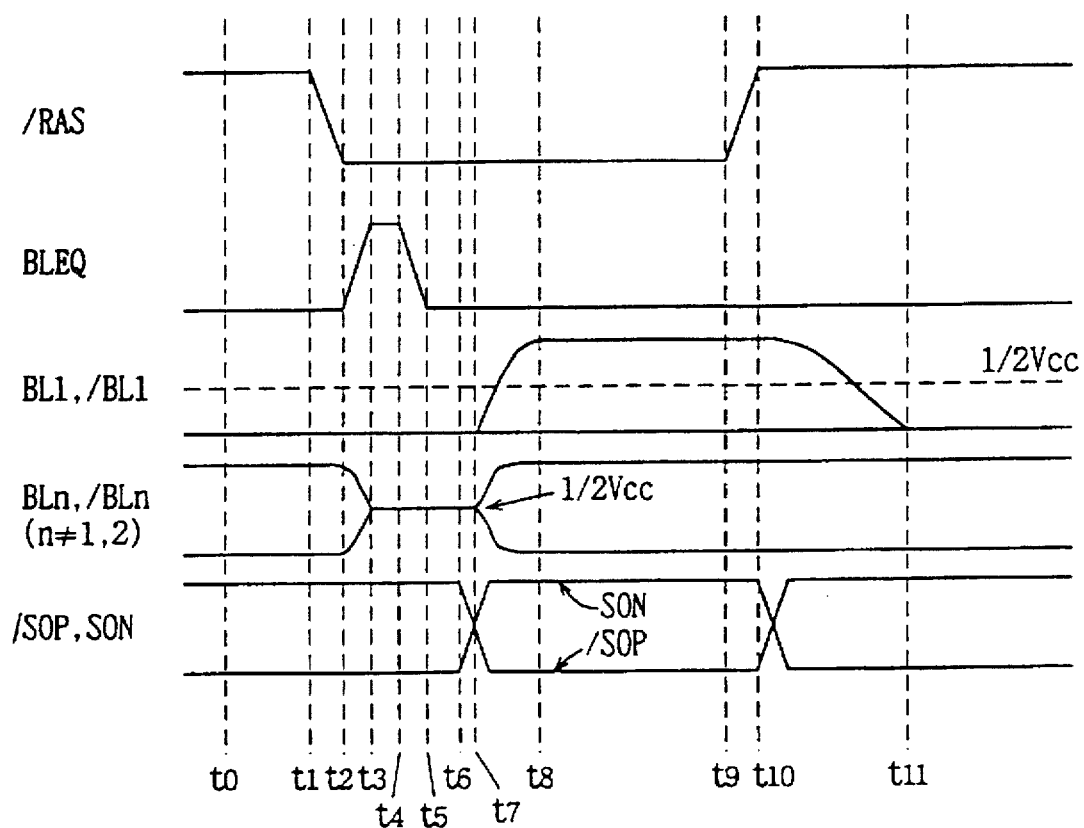
FIG. 9 is a timing chart showing an operation of a fifth embodiment of the present invention.

The operation of the fourth embodiment is basically similar to that of the fifth embodiment. The operation thereof will be described hereinafter with reference to the timing chart of FIG. 9.

At time $t_0$, one bit line of bit line pair $BL_n$, /$BL_n$ ($n \ne 1,2$) in a proper bit line pair group attains the level of potential $V_{cc}$ and the other attains the level of ground potential, maintained at an electrically floating state.

At the transition of row address strobe signals /RAS to an L level from an H level at time $t_1$, signal BLEQ provides a pulse of an H level during the period of time $t_2$ to $t_5$.

In response to the pair of bit lines connected by equalize circuit 14, the bit lines are both driven to the level of the common potential of $½ V_{cc}$ to attain a state similar to a precharged state.

The pair of line S2 attains a floating state in which line S2P attains the level of potential $V_{cc}$ and line S2N attains the level of ground potential due to the inactive states of signals /SOP and SON just before signal BLEQ reaches an H level.

When signal BLEQ attains an H level, line S2 is coupled by S2 line equalize circuit S2-EQ while attaining a floating state. Therefore, the potential of line S2 attains the level of $½ V_{cc}$.

According to the above operation, a state similar to the case where the bit line pair and the S2 line pair are both precharged is obtained.

At time $t_7$, the sense amplifier is rendered active, whereby the potential difference of the bit line pair is amplified.

Here, the potential difference of bit line pair BLE1, /BL1 connected to defective memory cell portion 200 is also amplified, and a readout operation is carried out.

At time $t_{10}$, the sense amplifier begins its transition to an inactive state. The S2 line pair attains a floating state again to be maintained with the potential difference of $V_{cc}$.

The bit line pair is also maintained with the potential difference of $V_{cc}$ in a floating state.

Although the potentials of bit lines BL1 and /BL1 are gradually lowered by leakage current, the predetermined level attained at $t_{11}$ is maintained. There is no flow of leakage current and no further reduction of the potential level is encountered.

According to the structure of the present embodiment, precharge power supply 4 is dispensable, and increase of power consumption during the stand-by state is suppressed.

Figure 10:
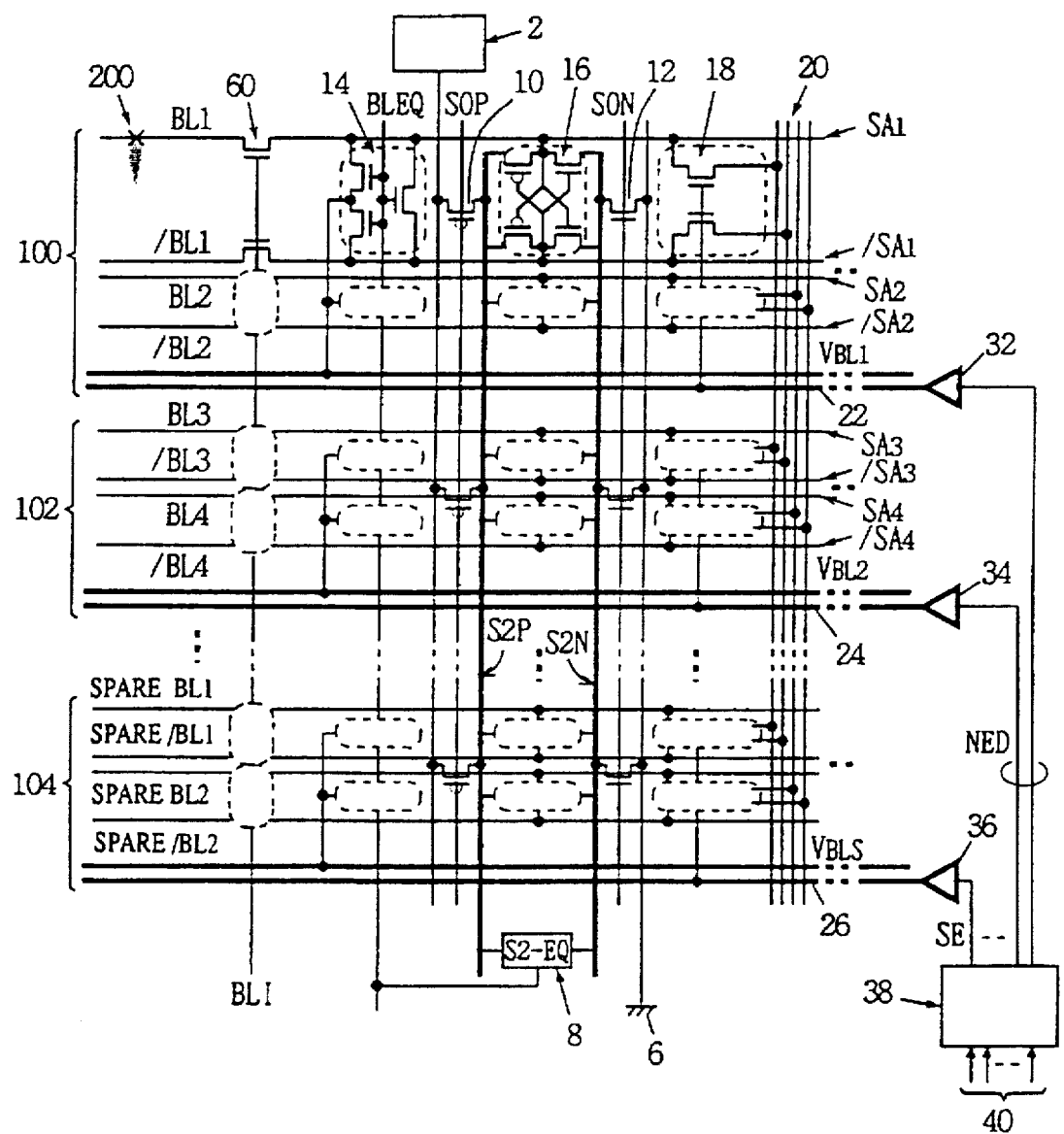
FIG. 10 is a block diagram schematically showing a sixth embodiment of the present invention.

FIG. 10 is a schematic block diagram showing components of a DRAM according to a sixth embodiment of the present invention.

The DRAM of the sixth embodiment differs from the DRAM of the fourth embodiment in the following two points.

Firstly, line S2 is not isolated for every bit line pair group unit.

Secondly, the side of the bit line pair where memory cells are provided can be isolated from the side of the bit line pair where the sense amplifier is provided by transfer gate 60.

The operation thereof will be described hereinafter with reference to the timing chart of FIG. 11.

At time $t_0$, signal BLI attains an L level, whereby floating gate 60 is turned off. The side of the bit line pair where memory cells are provided is isolated from the side of the bit line pair where the sense amplifiers are provided.

The bit line pair of the memory cell side attains a floating state. The bit line pair of the sense amplifier side is maintained with the potential difference of $V_{cc}$ since the sense amplifier attains an active state.

The sense amplifier attains an active state, and the S2 line pair has line S2P driven to the level of potential $V_{cc}$ and line S2N driven to the level of ground potential.

Following the transition of row strobe signal /RAS to an L level from an H level at time $t_1$, signal BLI is pulled up to an H level from an L level at time $t_3$. As a result, transfer gate 60 is turned on, whereby the bit line pair of the memory cell side is coupled to that of the sense amplifier side.

At time $t_2$, sense amplifier is rendered inactive. As a result, the S2 line pair attains a floating state to be maintained at the level of potential difference $V_{cc}$.

During time $t_3$ to $t_6$, signal BLEQ attains an H level in a pulsive manner. By equalize circuit 14, the bit line pair attaining a floating state is connected, so that the potential thereof attains the level of ½ $V_{cc}$.

The S2 line pair of S2P and S2N are also connected by equalize circuit 8 to result in potential ½ $V_{cc}$.

Thus, the bit line pair and the S2 line pair attain a state identical to a precharged state.

At time $t_8$, the sense amplifier is rendered active, to amplify the potential difference of the bit line pair according to stored information in the memory cell connected thereto.

At time $t_{12}$, signal BLI attains an L level, whereby transfer gate 60 is turned off.

The bit line pair attains a floating state and is maintained with the potential difference of $V_{cc}$. The S2 line pair attains an active state wherein line S2P attains the level of potential $V_{cc}$ and line S2N attains the level of ground potential.

Although the potential of bit lines BL1 and /BL1 connected to defective memory cell portion 200 is lowered by leakage current, the potential level is ascertained at time $t_{13}$. There is no flow of leakage current thereafter.

As appreciated from the above operation, a precharge power supply is not required according to the structure of the present embodiment. Increase in consumption power during stand-by after repair of a defective bit can also be suppressed.

Furthermore, the problem of reduction in the latching ability of the sense amplifier is eliminated since line S2 is not isolated.

Figure 11:
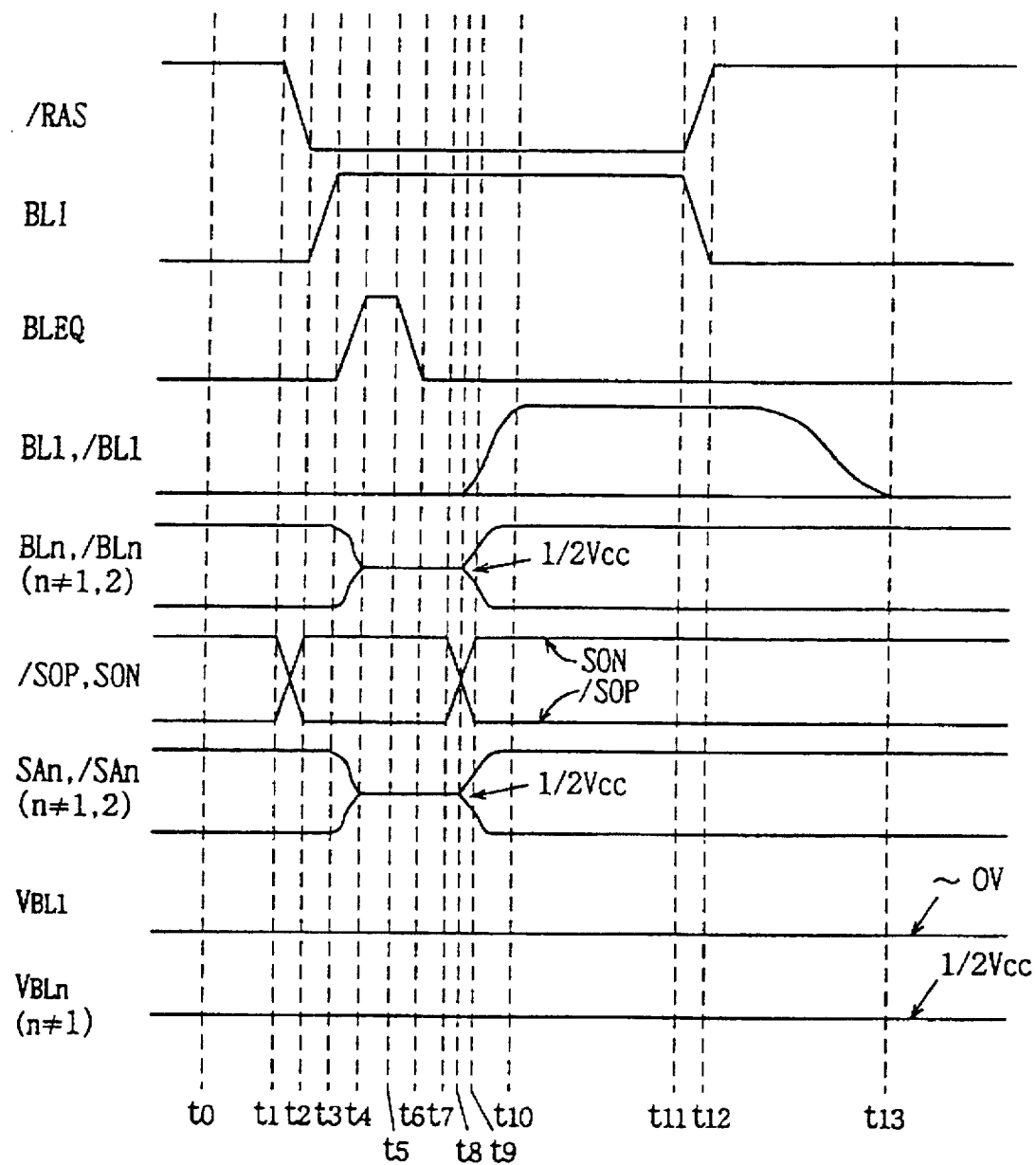
FIG. 11 is a timing chart showing an operation of the sixth embodiment of the present invention.

According to the operation method shown in FIG. 11 of the circuit of the sixth embodiment, the sense amplifier attains an active state even during a stand-by state where no reading/writing of stored information of a memory cell is carried out by the sense amplifier.

Therefore, there is a high possibility of a small stand-by current flow by the subthreshold current of the transistor forming a sense amplifier.

In order to avoid this problem, only the threshold voltage must be increased of the transistor forming a sense amplifier.

Figure 12:
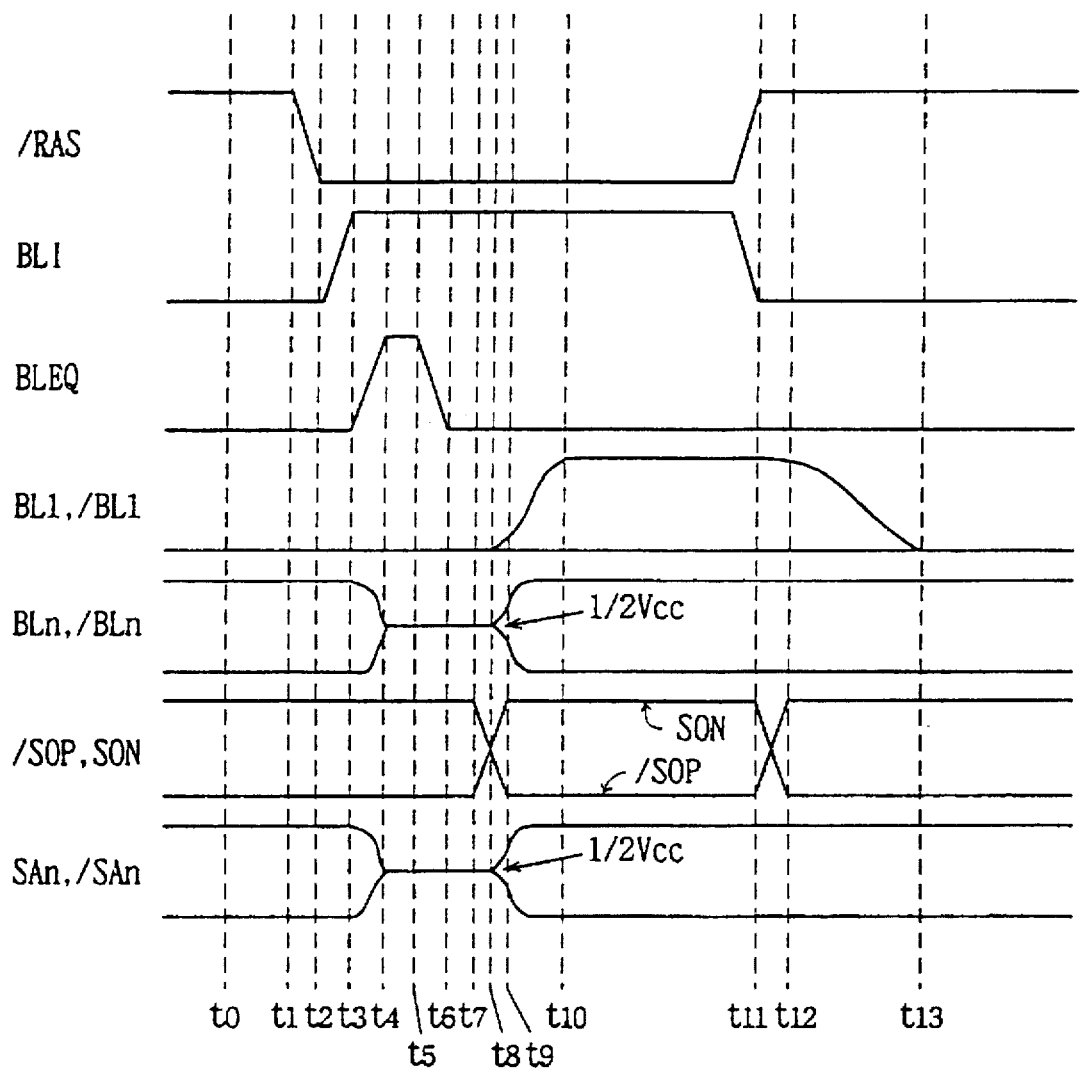
FIG. 12 is a timing chart showing an operation of a seventh embodiment of the present invention.

An operation method of rendering the sense amplifier inactive during stand-by according to a seventh embodiment of the present invention will be described with reference to the timing chart of FIG. 12.

The operation of the seventh embodiment differs from the operation of FIG. 11 in that sense amplifier attains an inactive state for all the period except during time $t_7$ and $t_{12}$ when the sense amplifier becomes active to amplify the potential difference of the bit line pair according to the memory cell information.

The precharge power supply is also not required in the present embodiment. Increase in consumption power during stand-by after repair of a defective bit is suppressed. Furthermore, the problem of reduction in the latching capability of sense amplifier is eliminated since line S2 is not isolated.

Current consumption during stand-by due to the subthreshold current of the transistor forming a sense amplifier is also suppressed.

Since the sense amplifier attains an inactive state during stand-by, the stand-by current will not increase even when there is leakage current in the sense amplifier portion.

Figure 13:
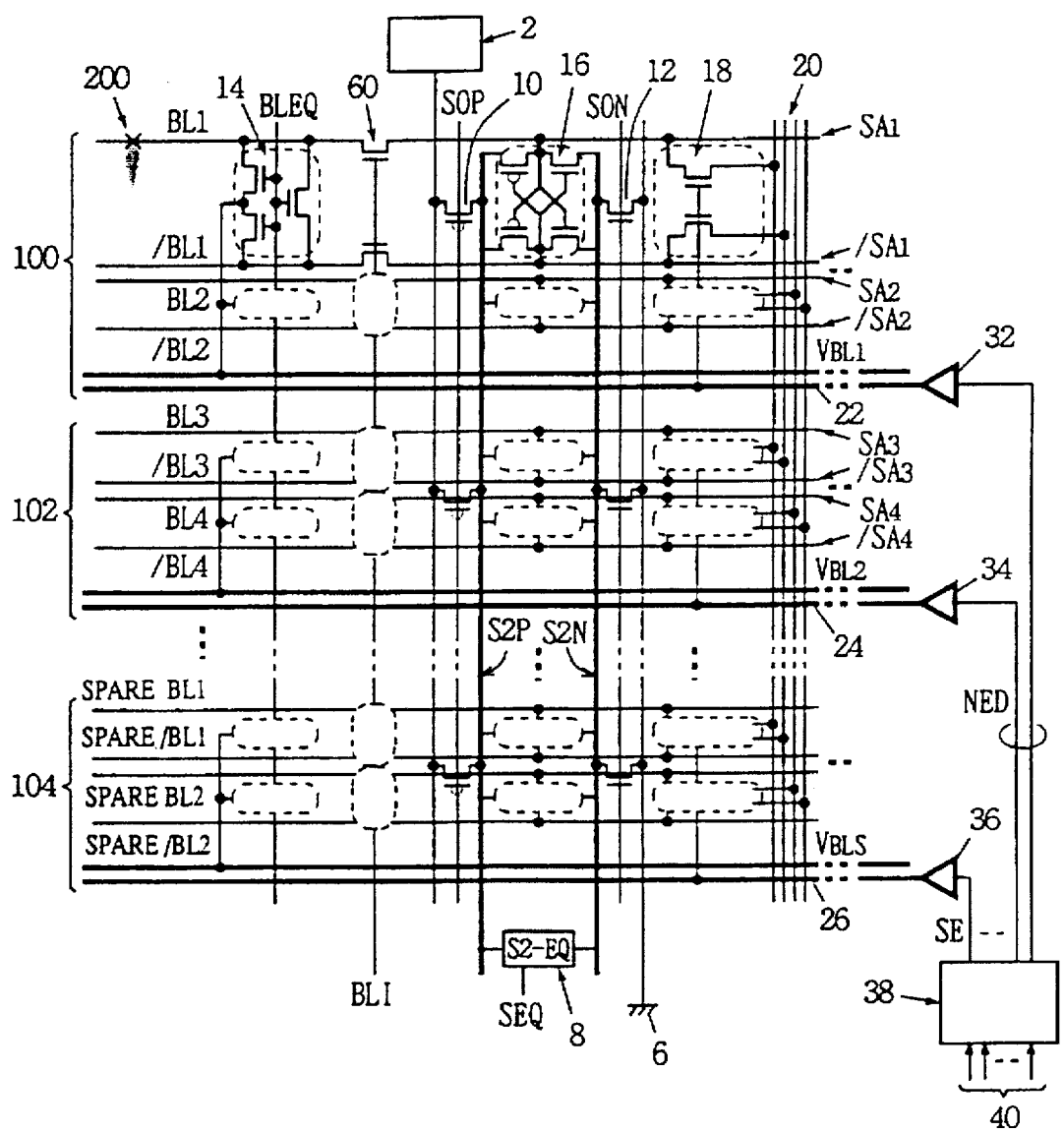
FIG. 13 is a block diagram schematically showing an eighth embodiment of the present invention.

FIG. 13 is a schematic block diagram showing the components of a DRAM according to an eighth embodiment of the present invention.

The DRAM of the eighth embodiment differs from the DRAM of the sixth embodiment in the following two points.

Firstly, equalize circuit 14 is connected to ground at the memory cell side, and not the sense amplifier side.

Secondly, equalize circuit 14 is controlled by signal BLEQ, and S2 line equalize circuit 8 is controlled by signal SEQ.

The operation thereof will be described hereinafter with reference to the timing chart of FIG. 14.

The substantially difference over the operation of the sixth embodiment shown in FIG. 11 is set forth in the following.

Following the transition of signal BLI to an L level from an H level to turn off transfer gate 60 at time $t_{12}$, signal BLEQ attains an H level in a pulsive manner from time $t_{13}$ to $t_{16}$. The potential of the bit line at the memory cell side (corresponds to bit lines $BL_n$, $/BL_n$ in the drawing) attains a level of ½ $V_{cc}$.

In FIG. 11, a high potential difference is constantly generated between a bit line and a storage node in a memory cell since the bit line pair is maintained with the potential difference of $V_{cc}$ even during stand-by. The possibility of the data of a memory cell leaking towards the bit line is increased.

By maintaining the bit line pair at the level of ½ $V_{cc}$ as in the present embodiment, the potential difference is reduced to alleviate the leakage current. More specifically, the amount of leakage of the cell data towards the bit line can be reduced.

Figure 14:
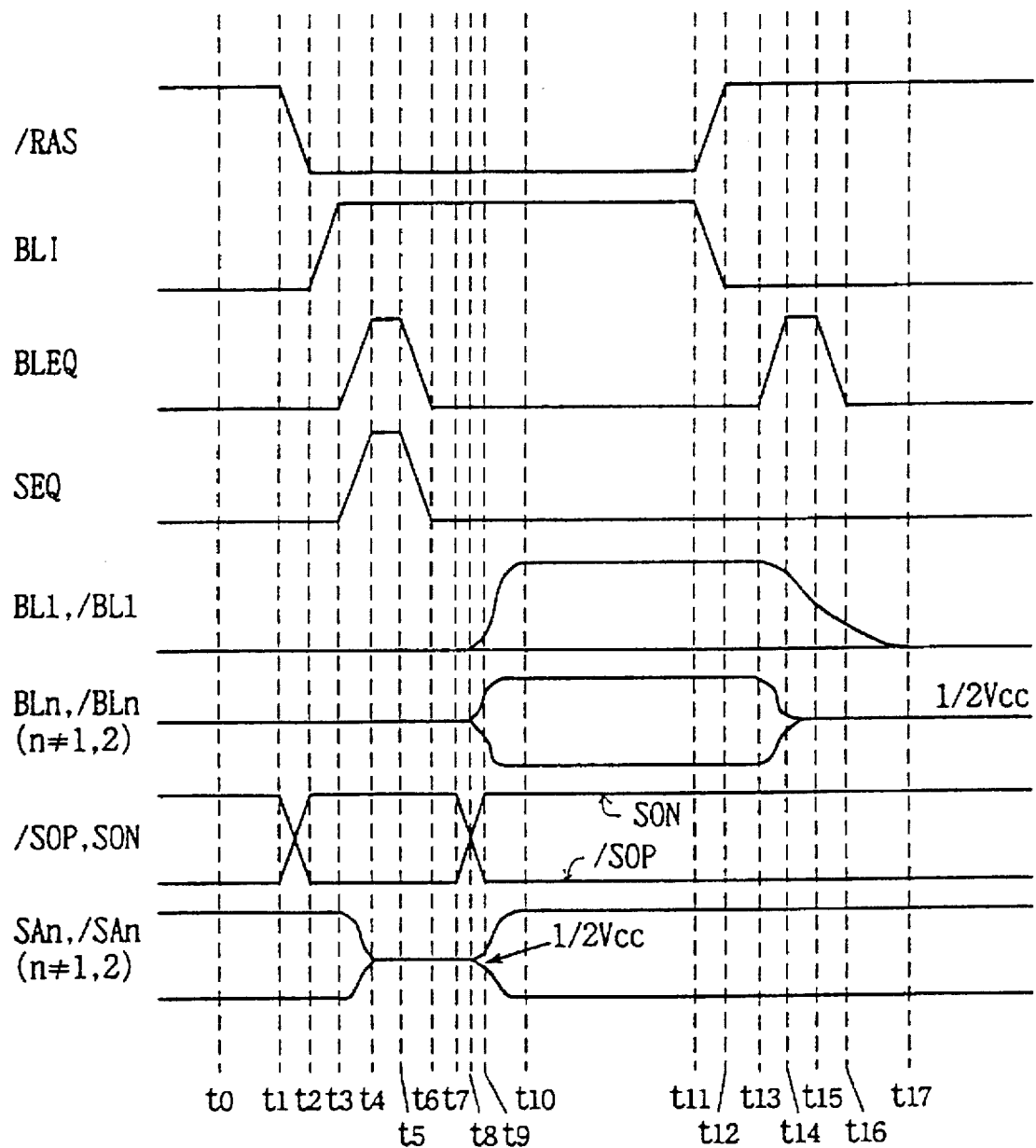
FIGS. 14 and 15 are timing charts showing the operations of the eighth and ninth embodiments, respectively of the present invention.

In the operation method shown in FIG. 14 of the circuit of the eighth embodiment, the sense amplifier attains an active state even during stand-by where no reading/writing of stored information of a memory cell is carried out.

Similar to the operation method of FIG. 11, there is a possibility of a small stand-by current flow due to the subthreshold current of the transistor forming a sense amplifier.

Figure 15:
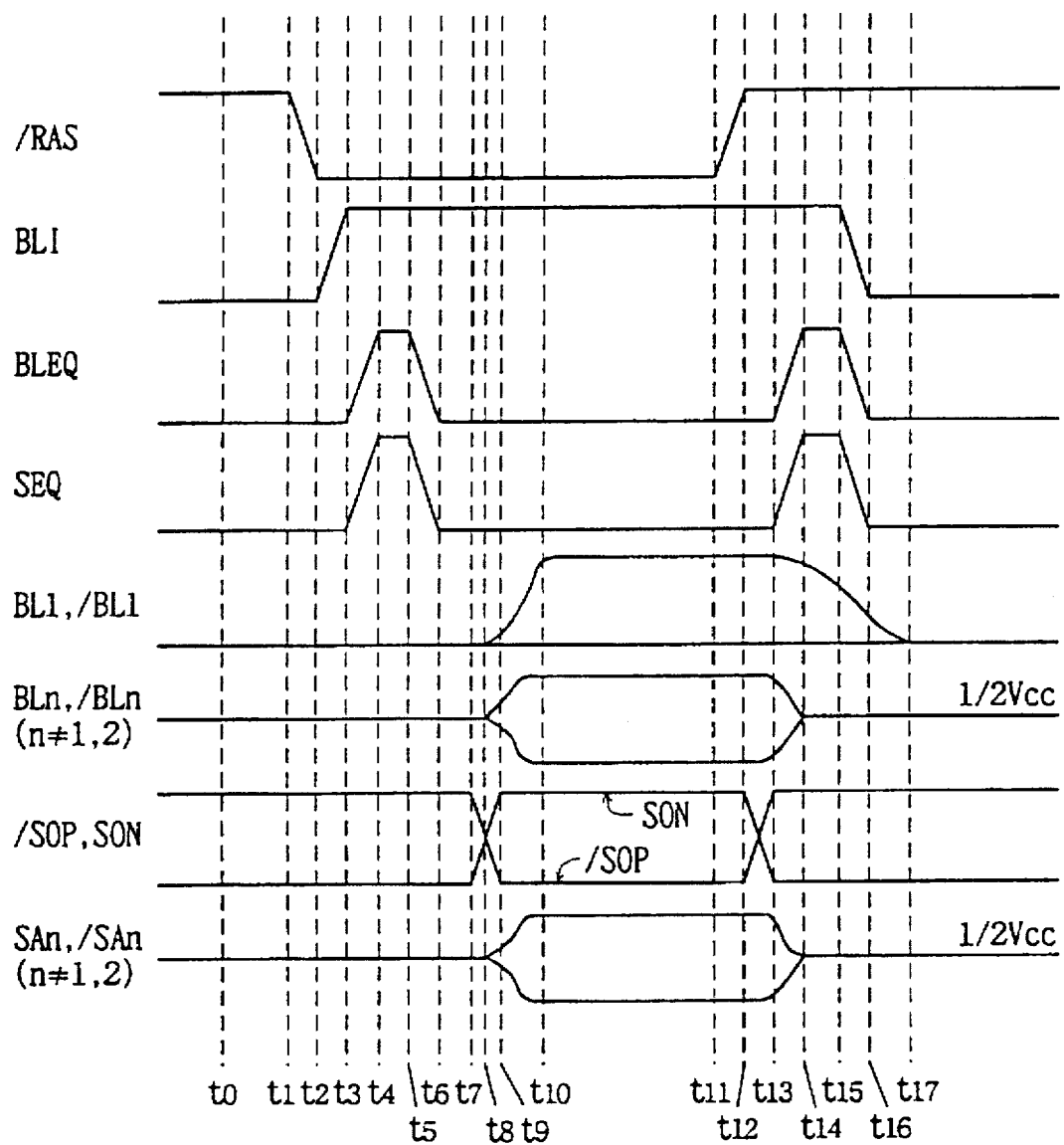

An operation method of rendering a sense amplifier inactive during stand-by according to a ninth embodiment of the present invention will be described hereinafter with reference to the timing chart of FIG. 15.

In contrast to the operation of FIG. 14, signals BLEQ and SEQ attain an H level in a pulsive manner from time $t_{13}$ and $t_{16}$, whereby the potential of the bit line pair and the potential of the S2 line pair attain the level of ½ $V_{cc}$ by equalize circuit 14 and S2 line equalize circuit 8, respectively, prior to the transition of signal BLI from an H level to an L level.

Therefore, the bit line pair and S2 line pair are both maintained at the floating state of the potential of ½ $V_{cc}$ during stand-by.

Thus, a small stand-by current flow due to the subthreshold current of the transistor forming a sense amplifier is suppressed. Also, the amount of leakage of the cell data towards the bit line is also reduced.

Furthermore, the stand-by current is not increased even when there is a leakage current in the sense amplifier portion since the sense amplifier is rendered inactive during stand-by.

Figure 16:
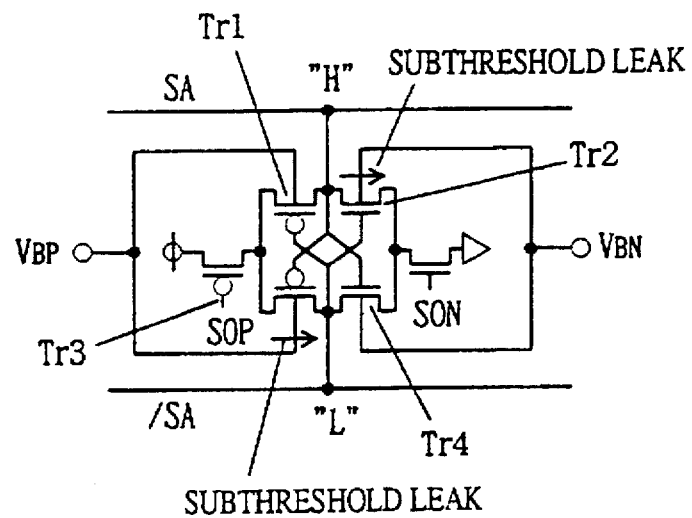
FIG. 16 is a circuit diagram showing a tenth embodiment of the present invention.

FIG. 16 is a circuit diagram of a sense amplifier according to a tenth embodiment of the present invention.

If the sense amplifier attains an active state during stand-by, there is a possibility of increase in stand-by current due to the subthreshold current of the transistor despite one of the p channel MOS transistor or n channel MOS transistor turned off, as in the sixth and eighth embodiments.

Referring to FIG. 16, it is assumed that the potential of interconnection SA attains an H level and the potential of interconnection /SA attains an L level. Transistors Tr2 and Tr3 are turned off. By the subthreshold current of these transistors, current flows from the power supply to ground to result in increase in the stand-by current.

According to the above structure, an approach can be taken to reduce this subthreshold leakage current during stand-by by varying the level of the backbias during stand-by so as to increase the threshold value higher than during an active state.

Figure 17:
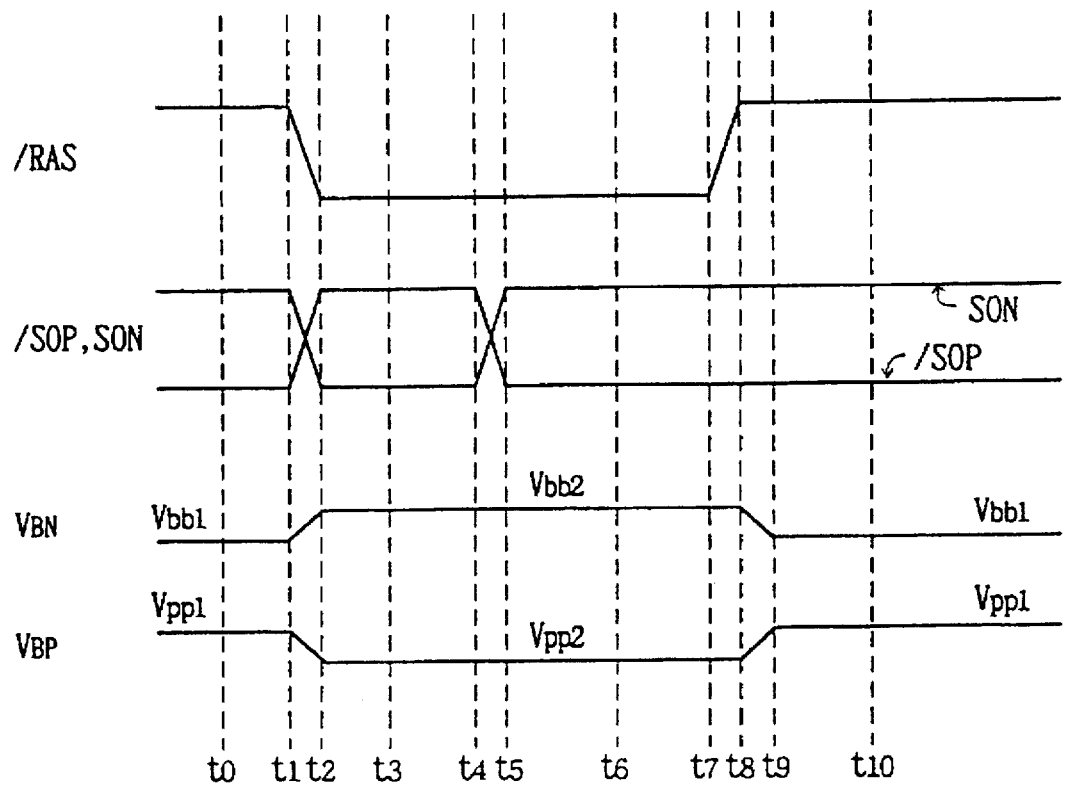
FIG. 17 is a timing chart showing an operation of the tenth embodiment of the present invention.

FIG. 17 is a timing chart showing such an operation.

Backbias $V_{BN}$ of the n channel MOS transistor is driven to the level of $V_{bb1}$ that is lower than the potential $V_{bb2}$ during a readout operation when the sense amplifier attains a stand-by state up to time $t_1$ and after time $t_9$.

Backbias $V_{BP}$ of the p channel MOS transistor is boosted to the level of $V_{bb1}$ which is higher than potential $V_{bb2}$ of a readout operation. According to the above operation, the subthreshold leakage current of the transistor forming the sense amplifier is reduced during a stand-by state.

The present embodiment of altering the threshold value of the transistor forming a sense amplifier by changing the backbias is particularly applicable to a device of the so-called SOI (Semiconductor On Insulator) structure. This is because the consumption current can be reduce by the above-described change since the parasitic capacitance in an SOI structure is significantly smaller than that of the well portion of a CMOS transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a memory cell array of a plurality of memory cells from/to which reading/writing of information is carried out with a constant number of memory cell columns or a constant number of memory cell rows as a unit, wherein a plurality of said reading/writing units form a normal memory cell array in said memory cell array, and at least one of said reading/writing unit in said memory cell array forms a spare memory cell array replacing the relevant reading/writing unit when said normal memory cell includes a defective memory cell, said semiconductor memory device comprising:

a first power supply for providing a first potential corresponding to a first logic level of said information, a second power supply for providing a second potential corresponding to a second logic level of said information, a plurality of bit lines, each connected to at least one of said memory cells, a plurality of sense amplifiers, each connected to said bit line for providing either one of the first potential and the second potential according to the stored information of said memory cell, wherein said sense amplifier comprises
a first power supply input node to which the first potential is supplied, and
a second power supply input node to which the second potential is supplied, said semiconductor memory device further comprising:

a third power supply for supplying a third potential, a plurality of power supply interconnections supplying said third potential to each said reading/writing unit of said memory cell array, a plurality of first switching means responsive to an external control signal for opening/closing connection of each said bit line and each of said first and second power supply input nodes of said sense amplifier to the third potential supplied from said plurality of power supply interconnections, and a plurality of second switching means that can set connection between said plurality of power supply interconnections and corresponding said plurality of reading/writing units individually and in a non-volatile manner.

2. The semiconductor memory device according to claim 1, wherein said bit line is provided as a pair for every said memory cell column and said memory cell row,
   wherein said each memory cell is connected to one bit line of a corresponding pair of bit lines,
   wherein said sense amplifier is provided for every said memory cell column or memory cell row for amplifying the stored information in each corresponding memory cell as potential difference between said pair of bit lines,
said semiconductor memory device further comprising:
first and second sense amplifier drive switching means for opening/closing respective connection of said first and second potentials to said first and second power supply input terminals of said sense amplifier, wherein at least one of said first and second sense amplifier drive switching means is provided for every of said memory cell column or memory cell row unit,
   wherein said first switching means comprises
       a first bit line equalize circuit provided for every said memory cell column or memory cell row for coupling potential of said pair of bit lines in common to the third power supply potential supplied from a corresponding said power supply interconnection, and
       a first sense amplifier precharge circuit provided for every said memory cell column or memory cell row unit for coupling potential of an interconnection pair formed of an interconnection connecting said first power supply input node of each of said sense amplifiers and an interconnection connecting said second power supply input node of each of said sense amplifiers in common to said third power supply potential supplied from a corresponding said power supply interconnection.

3. The semiconductor memory device according to claim 2, further comprising:
   an input/output data line for transmitting stored information of said memory cell to an external output terminal, and
   bit line pair select switching means connecting said input/output data line to said bit line pair,
   wherein said bit line pair select switching means comprises
       a first N channel MOSFET having a source coupled to said first potential, and
       a second N channel MOSFET having a source connected to a drain of said first N channel MOSFET, and a drain connected to said input/output data line,
   wherein one of said first N channel MOSFET and said second N channel MOSFET has its gate supplied with an external input/output control signal and the other has its gate connected to said bit line.

4. The semiconductor memory device according to claim 1, wherein said bit line is provided in a pair for every said memory cell column and memory cell row,
   wherein said each memory cell is connected to one bit line of a corresponding said bit line pair,
   wherein said sense amplifier is provided for every said memory cell column for memory cell row for amplifying each stored information of a corresponding said memory cell as potential difference between the bit lines of said pair,
   said semiconductor memory device further comprising:
       a first interconnection connected in common to the first power supply input node of each of said sense amplifiers belonging to at least two units of said memory cell column or memory cell row,
       third sense amplifier drive switching means for opening/closing connection of said first interconnection to said first power supply,
       a second interconnection forming a pair with said first interconnection, connected in common to the second power supply input node of each of said sense amplifiers, and
       fourth sense amplifier drive switching means for opening/closing connection of said second interconnection to said second power supply,
   wherein said first switching means comprises
       second and third bit line equalize circuits provided for every said memory cell column or memory cell row for coupling potential of said pair of bit lines in common to the third potential supplied from a corresponding said power supply interconnection, and
       a second sense amplifier precharge circuit for coupling potential of said first interconnection and potential of said second interconnection in common to said third potential,
   said semiconductor memory device further comprising bit line pair isolation switching means provided for every said memory cell column or memory cell row, disposed intermediate between said second and third bit line equalize circuits of said pair of bit lines, for opening/closing connection of said pair of bit lines between said second bit line equalize circuit side and said third bit line equalize circuit side.

5. A semiconductor memory device including a memory cell array of a plurality of memory cells from/to which reading/writing of information is carried out with a constant number of memory cell rows as a unit, wherein a plurality of said reading/writing units form a normal memory cell array in said memory cell array, and at least on& of said reading/writing unit in said memory cell array forms a spare memory cell array replacing the relevant reading/writing unit when said normal memory cell includes a defective memory cell, said semiconductor memory device comprising:
   a first power supply for providing a first potential corresponding to a first logic level of said information,
   a second power supply for providing a second potential corresponding to a second logic level of said information,
   a plurality of sense amplifiers, each provided for every said memory cell column or memory cell row for amplifying stored information of each corresponding memory cell,
   wherein said sense amplifier includes
       a first power supply input node to which said first potential is supplied,
       a second power supply input node to which said second potential is supplied,
       a pair of interconnections held at a third potential intermediate said first and second potentials before a reading/writing operation of information is initiated, and that can be electrically connected to said memory cell, wherein at least one of said pair of interconnections is present in said memory cell column or memory cell row unit,
   wherein said pair of interconnections includes
       a plurality of bit line pairs, provided for each said memory cell column or memory cell row, for connecting said memory cell to said corresponding sense amplifier, a power supply line pair provided for every said memory cell column or memory cell row unit for supplying said first and second power supply input nodes of said sense amplifier respectively, said semiconductor memory device further comprising:

first switching means provided for each of said interconnection pair, responsive to an external control signal for switching between a first state in which one interconnection of said pair of interconnections is set to a first potential and the other is set to said second potential, and a second state in which said pair of interconnections is set at an electrically floating state, wherein said first switching means for said power supply interconnection pair includes first and second sense amplifier drive switching means for opening/closing respective connection between said power supply line pair and said first and second power supply input nodes of said sense amplifier, wherein said first switching means corresponding to said bit line pair includes said sense amplifier rendered active at said first state and inactive at said second state, said semiconductor memory device further comprising:

second switching means provided for every said pair of interconnections for opening/closing connection between said pair of interconnections.

6. The semiconductor memory device according to claim 5, further comprising:

input/output data line for transmitting stored information of said memory cell to an external output terminal, switching means for connecting said input/output data line with said bit line, wherein said switching means comprises a first N channel MOSFET having a source coupled to said first potential, and a second N channel MOSFET having a source connected to a drain of said first N channel MOSFET and a drain connected to said input/output data line, wherein one of said first and second N channel MOSFETs has its gate supplied with an external input/output control signal, and the other has its gate connected to said bit line.

7. A semiconductor memory device including a memory cell array of a plurality of memory cells from/to which reading/writing of information is carried out with a constant number of memory cell rows as a unit, wherein a plurality of said reading/writing units form a normal memory cell array in said memory cell array, and at least one of said reading/writing unit in said memory cell array forms a spare memory cell array replacing the relevant reading/writing unit when said normal memory cell includes a defective memory cell, said semiconductor memory device comprising:

a first power supply for providing a first potential corresponding to a first logic level of said information, a second power supply for providing a second potential corresponding to a second logic level of said information, a plurality of sense amplifiers, each provided for every said memory cell column or memory cell row, for amplifying stored information in each corresponding memory cell, wherein said sense amplifier comprises a first power supply input node to which said first potential is supplied, a second power supply input node to which said second potential is supplied, a pair of interconnections held at a third potential intermediate said first and second potentials before a reading/writing operation of information is initiated, and that can be electrically connected to said memory cell, wherein at least one of said pair of interconnections is present in said memory cell column or memory cell row unit, wherein said pair of interconnections includes a plurality of bit lines pairs, provided for each said memory cell column or memory cell row, for connecting said memory cell to said corresponding sense amplifier, said semiconductor memory device further comprising:

first switching means provided for each of said interconnection pair, responsive to an external control signal for switching between a first state in which one interconnection of said pair of interconnections is set to a first potential and the other is set to said second potential, and a second state in which said pair of interconnections is set at an electrically floating state, wherein said first switching means corresponding to said bit line pair includes said sense amplifier rendered active at said first state for driving one bit line of said bit line pair to said first potential and the other to said second potential, and rendered inactive state at said second state, said semiconductor memory device further comprising:

a first interconnection connected in common to the first power supply input node of each of said sense amplifiers belonging to at least two units of said memory cell column or memory cell row, first sense amplifier drive switching means for opening/closing connection of said first interconnection to said first power supply, a second interconnection forming a pair with said first interconnection, connected in common to the second power supply input node of each of said sense amplifiers, second sense amplifier drive switching means for opening/closing connection of said second interconnection to said second power supply, sense amplifier precharge means for opening/closing connection between said first and second interconnections prior to initiation of a reading/writing operation of information of said memory cell, bit line pair precharge means provided for every said bit line pair for opening/closing connection between said pair of bit lines, and bit line pair isolation switching means for opening/closing connection of said bit line pair between the side where said memory cell is connected and the side where said sense amplifier and said bit line precharge means are provided.

8. An operation method of the semiconductor memory device according to claim 7, comprising:

a first step of setting said sense amplifier at the first state to drive one bit line of said bit line pair to said first potential and the other to said second potential, rendering said second switching means non-conductive, rendering said third and fourth sense amplifier drive switching means both conductive to set said first and second interconnections at said first and second potentials, respectively, rendering said sense amplifier precharge means non-conductive, and rendering said bit line pair isolation switching means non-conductive, a second step responsive to said external control signal of setting said sense amplifier at said second state to drive said bit line pair to an electrically floating state, rendering said second switching means conductive state to set the potential of said bit line pair at said third potential, rendering said third and fourth sense amplifier drive switching means both non-conductive to render said first and second interconnections to an electrically floating state, rendering said sense amplifier precharge means to a conductive state to set said first and second interconnections at said third potential, and rendering said bit line pair isolation switching means conductive, a third step responsive to said external control signal of setting said sense amplifier at the first state to drive one bit line of said bit line pair to said first potential and the other to said second potential according to stored information in said memory cell, rendering said second switching means non-conductive, and said third and fourth sense amplifier drive switching means both conductive to set said first and second interconnections at said first and second potentials, respectively, rendering said sense amplifier precharge means non-conductive, and holding said bit line pair isolation switching means at the conductive state, and a fourth step responsive to said external control signal of rendering said bit line pair isolation switching means non-conductive to set said semiconductor memory device at a state identical to that of said first step.

9. An operation method of the semiconductor memory device according to claim 7, comprising:

a first step of setting said sense amplifier attaining said second state to set said bit line pair at an electrically floating state, rendering said second switching means non-conductive, rendering said third and fourth sense amplifier driving switching means both non-conductive to set said first and second interconnections at an electrically floating state, rendering said sense amplifier precharge means non-conductive, and rendering said bit line pair isolation switching means non-conductive, a second step responsive to said external control signal of leaving said sense amplifier at said second state, said bit line pair still at the electrically floating state, and rendering said second switching means conductive to set the potential of said bit line pair at said third potential, leaving said third and fourth sense amplifier drive switching means both non-conductive to leave said first and second interconnections still at the electrically floating state, rendering said sense amplifier precharge means conductive to set said first and second interconnections at said third potential, and rendering said bit line pair isolation switching means conductive, a third step responsive to said external control signal of setting said sense amplifier at said first state to drive one bit line of said bit line pair to said first potential and the other to said second potential according to stored information in said memory cell, rendering said second switching means non-conductive, rendering said third and fourth sense amplifier drive switching means both conductive to set said first and second interconnections at said first and second potentials, respectively, rendering said sense amplifier precharge means non-conductive, and leaving said bit line pair isolation switching means conductive, and a fourth step responsive to said external control signal of setting said sense amplifier at said second state to set said bit line pair at an electrically floating state, leaving said second switching means non-conductive, rendering said third and fourth sense amplifier drive switching means both non-conductive to set said first and second interconnections at an electrically floating state, leaving said sense amplifier precharge means non-conductive, rendering said bit line pair isolation switching means non-conductive to set said semiconductor memory device at a state identical to that of said first step.

10. A semiconductor memory device including a memory cell array of a plurality of memory cells from/to which reading/writing of information is carried out with a constant number of memory cell rows as a unit, wherein a plurality of said reading/writing units form a normal memory cell array in said memory cell array, and at least one of said reading/writing unit in said memory cell array forms a spare memory cell array replacing the relevant reading/writing unit when said normal memory cell includes a defective memory cell, said semiconductor memory device comprising:

a first power supply for providing a first potential corresponding to a first logic level of said information, a second power supply for providing a second potential corresponding to a second logic level of said information, a plurality of sense amplifiers, each provided for every said memory cell column or memory cell row for amplifying stored information in each corresponding memory cell, wherein said sense amplifier comprises a first power supply input node to which said first potential is supplied, a second power supply input node to which said second potential is supplied, a pair of interconnections held at a third potential intermediate said first and second potentials before a reading/writing operation of information is initiated, and that can be electrically connected to said memory cell, wherein at least one of said pair of interconnections is present in said memory cell column or memory cell row unit, wherein said pair of interconnections includes a plurality of bit line pairs, provided for each said memory cell column or memory cell row, for connecting said memory cell to said corresponding sense amplifier, said semiconductor memory device further comprising:

first switching means provided for each of said interconnection pair, responsive to an external control signal for switching between a first state in which one interconnection of said pair of interconnections is set to a first potential and the other is set to said second potential, and a second state in which said pair of interconnections is set at an electrically floating state, wherein said first switching means corresponding to said bit line pair includes said sense amplifier rendered active at said first state for driving one bit line of said bit line pair to said first potential and the other to said second potential, and rendered inactive at said second state, said semiconductor memory device further comprising:

a first interconnection connected in common to the first power supply input node of each of said sense amplifiers belonging to at least two units of said memory cell column or memory cell row, first sense amplifier drive switching means for opening/closing connection of said first interconnection to said first power supply, a second interconnection forming a pair with said first interconnection, connected in common to the second power supply input node of each of said sense amplifiers, second sense amplifier drive switching means for opening/closing connection of said second interconnection to said second power supply, sense amplifier precharge means for opening/closing connection between said first and second interconnections prior to initiation of a reading/writing operation of stored information of said memory cell, bit line pair precharge means provided for every said bit line pair for opening/closing connection between said pair of bit lines, and bit line pair isolation switching means for opening/closing connection of said bit line pair between the first side where said memory cell and said bit line precharge means are provided and the second side where said sense amplifier is provided.

11. An operation method of the semiconductor memory device according to claim 10, comprising:

a first step of setting said sense amplifier at the first state, rendering said bit line pair isolation switching means non-conductive, setting both bit lines of said bit line pair at the first side at said third potential, and one bit line of said bit line pair to the first potential and the other to said second potential at the second side of said bit line pair, rendering said second switching means non-conductive, rendering said fifth and sixth sense amplifier drive switching means both conductive to set said first and second interconnections at said first and second potentials, respectively, and rendering said sense amplifier precharge means non-conductive, a second step responsive to said external control signal of rendering said sense amplifier to said second state to set said bit line pair to an electrically floating state, rendering said bit line pair isolation switching means conductive, rendering said second switching means conductive to set the potential of said bit line pairs of said first and second sides in common at said third potential, rendering said fifth and sixth sense amplifier driving switching means both non-conductive to set said first and second interconnections at an electrically floating state, rendering said sense amplifier precharge means conductive to set said first and second interconnections at said third potential, a third step responsive to said external control signal of setting said sense amplifier at said first state and leaving said bit line pair isolation switching means at the conductive state to drive the potential of one of said pair of bit lines to said first potential and the other to said second potential at both the first and second sides of said bit line pairs according to stored information in said memory cell, rendering said second switching means non-conductive, and said fifth and sixth sense amplifier drive switching means both conductive, setting said first and second interconnections at said first and second potentials, respectively, and rendering said sense amplifier precharge means non-conductive, a fourth step responsive to said external control signal of leaving said sense amplifier at the first state, rendering said bit line pair isolation switching means non-conductive, rendering said second switching means conductive to set the potential of both bit lines of said bit line pair to said third potential at the first side of said bit line pairs, and to set one bit line of said bit line pair at the first potential and the other at the second potential at the second side of said bit line pair, rendering said fifth and sixth sense amplifier drive switching means both conductive to set said first and second interconnections at said first and second potentials, respectively, and leaving said sense amplifier precharge means at the non-conductive state, and a fifth step responsive to said external control signal of rendering said second switching means non-conductive to set second semiconductor memory device at a state equal to that of said first step.

12. An operation method of the semiconductor memory device according to claim 10, comprising:

a first step of setting said sense amplifier at said second state to set said bit line pair at an electrically floating state, rendering said bit line pair isolation switching means non-conductive to set the potential of said bit line at said third potential of both the first and second sides of said bit line pairs, rendering said second switching means non-conductive, rendering said fifth and sixth sense amplifier drive switching means both non-conductive to set said first and second interconnections at an electrically floating state as the third potential, and rendering said sense amplifier precharge means non-conductive, a second step responsive to said external control signal of leaving said sense amplifier at said second state to leave said bit line pair at the electrically floating state, rendering said bit line pair isolation switching means conductive, rendering said second switching means conductive, leaving said fifth and sixth sense amplifier driving switching means both non-conductive to leave said first and second interconnections still at the electrically floating state, and rendering said sense amplifier precharge means conductive, a third step responsive to said external control signal of setting said sense amplifier at said first state and leaving said bit line pair isolation switching means conductive to drive one bit line of said bit line pair to said first potential and the other to said second potential according to stored information of said memory cell, rendering said second switching means non-conductive, rendering said fifth and sixth sense amplifier drive switching means both conductive to set said first and second interconnections at said first and second potentials, respectively, and rendering said sense amplifier precharge means non-conductive, a fourth step responsive to said external control signal of setting said sense amplifier at said second state to set said bit line pair at an electrically floating state, leaving said bit line pair isolation switching means conductive, rendering said second switching means conductive to set said bit line pairs of both said first and second sides at said third potential, rendering said fifth and sixth sense amplifier drive switching means both non-conductive to set said first and second interconnections at an electrically floating state, rendering said sense amplifier precharge means conductive, and setting said first and second interconnections at said third potential, and a fifth step responsive to said external control signal of rendering said second switching means non-conductive, rendering said sense amplifier precharge means non-conductive, rendering said bit line pair isolation switching means non-conductive to set said semiconductor memory device at a state identical to that of said first step.

13. The semiconductor memory device according to claim 7, further comprising bias means in which backbias of an MOS transistor forming a sense amplifier is altered to the side where the threshold value is increased in a state where a reading/writing operation is not carried out.

14. The semiconductor memory device according to claim 10, further comprising bias means in which backbias of an MOS transistor forming a sense amplifier is altered to the side where the threshold value is increased in a state where a reading/writing operation is not carried out.

15. Semiconductor memory device including a memory cell array of a plurality of memory cells from/to which reading/writing of information is carried out with a constant number of memory cell rows as a unit, wherein a plurality of said reading/writing units form a normal memory cell array in said memory cell array, and at least one of said reading/writing unit in said memory cell array forms a spare memory cell array replacing the relevant reading/writing unit when said normal memory cell includes a defective memory cell, said semiconductor memory device comprising:

a first power supply for providing a first potential corresponding to a first logic level of said information, a second power supply for providing a second potential corresponding to a second logic level of said information, a plurality of bit lines pairs, provided for every said memory cell column or memory cell row and connecting to a corresponding said memory cell, a plurality of sense amplifiers, provided for every said bit line pair, each amplifying a potential difference between a corresponding said bit line pair according to the stored information of corresponding said memory cell, wherein said sense amplifier includes
a first power supply input node to which the first potential is supplied, and
a second power supply input node to which the second potential is supplied, said semiconductor memory device further comprising:
a third power supply for supplying a third potential, a plurality of power supply interconnections supplying said third potential to each said reading/writing unit of said memory cell array, a first interconnection connected in common to the first power supply input node of each of said sense amplifiers belonging to at least two units of said memory cell column or memory cell row, first sense amplifier drive switching means for opening/closing connection of said first interconnection to said first power supply, a second interconnection forming a pair with said first interconnection, connected in common to the second power supply input node of each of said sense amplifiers, and second sense amplifier drive switching means for opening/closing connection of said second interconnection to said second power supply, first bit line equalize circuits, provided for every said memory cell column or memory cell row, responsive to first control signal for coupling potential of said pair of bit lines in common to the third potential supplied from a corresponding said power supply interconnection, second bit line equalize circuits, provided for every said memory cell column or memory cell row, responsive to second control signal for coupling potential of said pair of bit liens in common to the third potential, a first sense amplifier precharge circuit responsive to third control signal for coupling potential of said first interconnection and potential of said second interconnection in common to said third potential, a plurality of second switching means that can set connection between said plurality of power supply interconnections and corresponding said plurality of reading/writing units individually and in a non-volatile manner, and bit line pair isolation switching means provided for every said memory cell column or memory cell row disposed intermediate between said first and second bit line equalize circuits of said pair of bit lines, for opening/closing connection of said pair of bit lines between said first bit line equalize circuit side and said second bit line equalize circuit side.

* * * * *